(12) United States Patent
Yamaguchi

(10) Patent No.: US 12,481,225 B2
(45) Date of Patent: Nov. 25, 2025

(54) MEASUREMENT APPARATUS, LITHOGRAPHY APPARATUS AND ARTICLE MANUFACTURING METHOD

(71) Applicant: CANON KABUSHIKI KAISHA, Tokyo (JP)

(72) Inventor: Wataru Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/319,711

(22) Filed: May 18, 2023

(65) Prior Publication Data

US 2023/0288823 A1 Sep. 14, 2023

Related U.S. Application Data

(63) Continuation of application No. 17/578,578, filed on Jan. 19, 2022, now Pat. No. 11,693,328.

(30) Foreign Application Priority Data

Jan. 29, 2021 (JP) .................. 2021-013597

(51) Int. Cl.
*G03F 7/00* (2006.01)
*G03F 9/00* (2006.01)
*G06T 7/00* (2017.01)

(52) U.S. Cl.
CPC ...... *G03F 7/70633* (2013.01); *G03F 7/70683* (2013.01); *G03F 9/7046* (2013.01);
(Continued)

(58) Field of Classification Search
CPC ............. G03F 7/70605; G03F 7/70616; G03F 7/70625; G03F 7/70633; G03F 7/70641;
(Continued)

(56) References Cited

U.S. PATENT DOCUMENTS 5,649,022 A * 7/1997 Maeda ..................... G06T 7/74
382/141
5,929,996 A 7/1999 Itagaki et al.
(Continued)

FOREIGN PATENT DOCUMENTS

CN 105467771 A 4/2016
CN 114565585 A 5/2022
(Continued)

OTHER PUBLICATIONS

Extended European search report issued in European Appln. No. 22150145.5 mailed on Jul. 4, 2022.
(Continued)

*Primary Examiner* — Gordon J Stock, Jr.
(74) *Attorney, Agent, or Firm* — ROSSI, KIMMS & McDOWELL LLP

(57) ABSTRACT

The present invention provides a measurement apparatus for measuring a position of a first pattern and a position of a second pattern provided in a target object, the apparatus including an image capturing unit including a plurality of pixels which detect light from the first pattern and light from the second pattern, and configured to form an image capturing region used to capture the first pattern and the second pattern by the plurality of pixels, and a control unit configured to adjust the image capturing unit such that a relative ratio of an intensity of a detection signal of the first pattern generated based on an output from a first image capturing region and an intensity of a detection signal of the second pattern generated based on an output from a second image capturing region falls within an allowable range.

20 Claims, 10 Drawing Sheets

(52) U.S. Cl.
CPC .......... *G03F 9/7076* (2013.01); *G03F 9/7088* (2013.01); *G03F 9/7092* (2013.01); *G06T 7/0004* (2013.01); G06T 2207/30148 (2013.01)

(58) Field of Classification Search
CPC ............... G03F 7/7065; G03F 7/70653; G03F 7/70681; G03F 7/70683; G03F 9/7003; G03F 9/7007; G03F 9/7026; G03F 9/7046; G03F 9/7049; G03F 9/7065; G03F 9/7069; G03F 9/7073; G03F 9/7076; G03F 9/708; G03F 9/7084; G03F 9/7088; G03F 9/7092; G03F 7/706851; G01B 11/03; G01B 11/026; G01B 11/25; G01B 11/14; G01B 11/26; G01B 11/27; G01B 11/272; G06T 7/0004; G06T 2207/30148
See application file for complete search history.

(56) References Cited

U.S. PATENT DOCUMENTS

| | | | |
|---|---|---|---|
| 6,416,912 B1 | 7/2002 | Kobayashi et al. | |
| 6,546,126 B1 | 4/2003 | Wittmann et al. | |
| 6,714,670 B1* | 3/2004 | Goldsworthy | G06T 7/0004 |
| | | | 382/149 |
| 7,126,670 B2* | 10/2006 | Hayashi | G03F 7/70775 |
| | | | 355/53 |
| 7,221,486 B2 | 5/2007 | Makihira et al. | |
| 7,424,145 B2* | 9/2008 | Horie | G03F 1/84 |
| | | | 716/112 |
| 7,580,116 B2 | 8/2009 | Maeda | |
| 7,640,530 B2* | 12/2009 | Ando | G06T 7/001 |
| | | | 716/51 |
| 7,831,083 B1 | 11/2010 | Lauber | |
| 8,339,570 B2 | 12/2012 | Tsujikawa | |
| 8,405,818 B2* | 3/2013 | Miyazaki | G03F 9/7026 |
| | | | 355/53 |
| 8,859,167 B2 | 10/2014 | Hagio et al. | |
| 9,733,578 B2* | 8/2017 | Hashimoto | G03F 7/70775 |
| 10,095,124 B2* | 10/2018 | Tsujikawa | G06T 7/0004 |
| 10,455,160 B2* | 10/2019 | Sakamoto | G03F 9/7088 |
| 10,656,541 B2 | 5/2020 | Maeda | |
| 10,897,566 B2* | 1/2021 | Gutman | G03F 7/20 |
| 11,079,692 B2* | 8/2021 | Yamaguchi | G03F 9/7026 |
| 11,156,929 B2* | 10/2021 | Miyazaki | G03F 9/7076 |
| 11,372,342 B2 | 6/2022 | Iwai et al. | |
| 11,531,276 B2 | 12/2022 | Akamatsu | |
| 11,693,328 B2* | 7/2023 | Yamaguchi | G03F 7/70633 |
| | | | 356/124 |
| 11,716,545 B2* | 8/2023 | Shionoya | H04N 25/60 |
| | | | 348/241 |
| 11,831,968 B2* | 11/2023 | Nakamura | H04N 23/55 |
| 12,347,096 B2* | 7/2025 | Lee | H04N 23/10 |
| 2003/0053059 A1* | 3/2003 | Mishima | G03F 9/7046 |
| | | | 356/401 |
| 2003/0054574 A1* | 3/2003 | Tanaka | G03F 9/7076 |
| | | | 438/4 |
| 2005/0062967 A1 | 3/2005 | Kobayashi | |
| 2010/0271609 A1 | 10/2010 | Tsujikawa | |
| 2012/0307226 A1 | 12/2012 | Maeda | |
| 2015/0253128 A1* | 9/2015 | Uemura | H04N 23/56 |
| | | | 348/135 |
| 2015/0338745 A1 | 11/2015 | Fukazawa | |
| 2019/0267329 A1 | 8/2019 | Tran et al. | |
| 2021/0208519 A1 | 7/2021 | Wang et al. | |
| 2023/0408249 A1* | 12/2023 | Yamaguchi | G03F 9/7088 |

FOREIGN PATENT DOCUMENTS

| | | | |
|---|---|---|---|
| JP | S5679204 A | 6/1981 | |
| JP | S63290901 A | 11/1988 | |
| JP | H07142300 A | 6/1995 | |
| JP | H11288867 A | * 10/1999 | |
| JP | 2001357382 A | 12/2001 | |
| JP | 2002198291 A | 7/2002 | |
| JP | 2003092247 A | 3/2003 | |
| JP | 2004119769 A | 4/2004 | |
| JP | 2005300172 A | 10/2005 | |
| JP | 2007180171 A | 7/2007 | |
| JP | 2009222399 A | 10/2009 | |
| JP | 2009231564 A | 10/2009 | |
| JP | 5180419 B2 | 4/2013 | |
| JP | 2014048180 A | 3/2014 | |
| JP | 5550253 B2 | 7/2014 | |
| TW | 201812484 A | 4/2018 | |
| TW | 202004372 A | 1/2020 | |
| WO | 9956308 A1 | 11/1999 | |
| WO | 0219415 A1 | 3/2002 | |
| WO | 03104746 A1 | 12/2003 | |
| WO | 2013085389 A2 | 6/2013 | |

OTHER PUBLICATIONS

Notice of Allowance issued in U.S. Appl. No. 17/578,578 mailed on Mar. 17, 2023.
Extended European search report issued in European Appln. No. 23196503.9, mailed on Jan. 30, 2024.
Office Action issued in Taiwanese Appln. No. 111100541, dated Jul. 22, 2024. English translation provided.
Office Action issued in Taiwanese Appln. No. 111100541, mailed Mar. 14, 2024. English translation provided.
Office Action issued in Chinese Appln. No. 202210104824.8 mailed on Jun. 25, 2025.

* cited by examiner

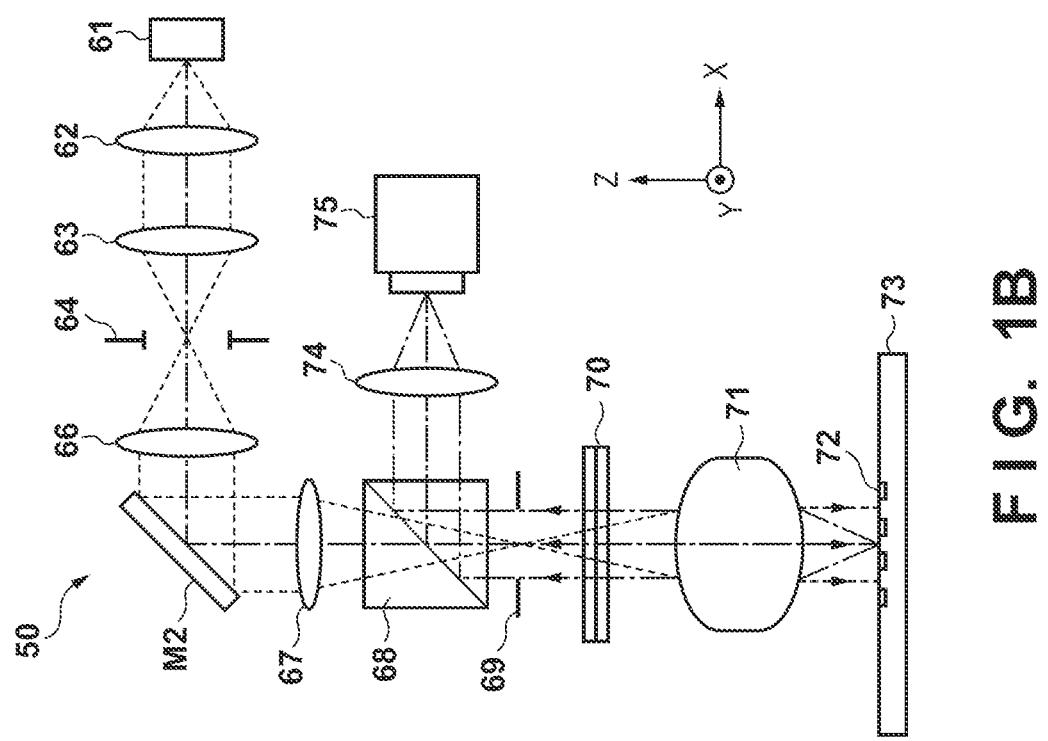
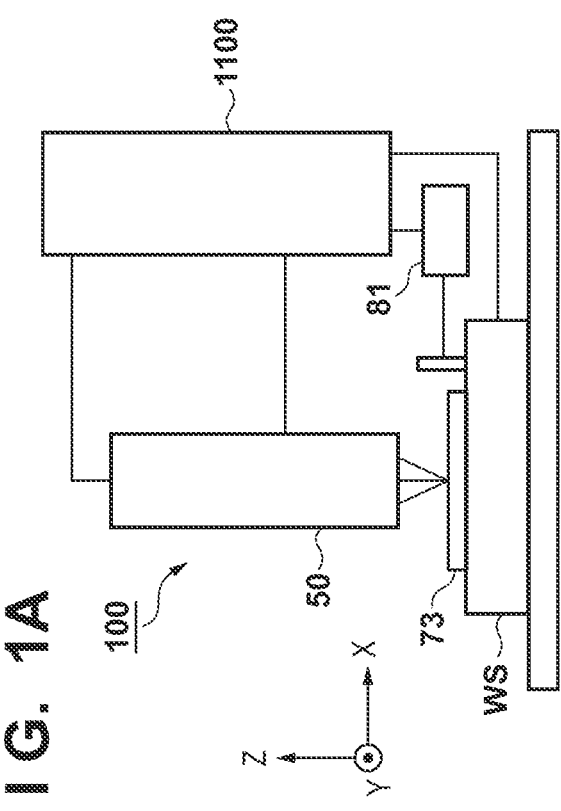
FIG. 1A
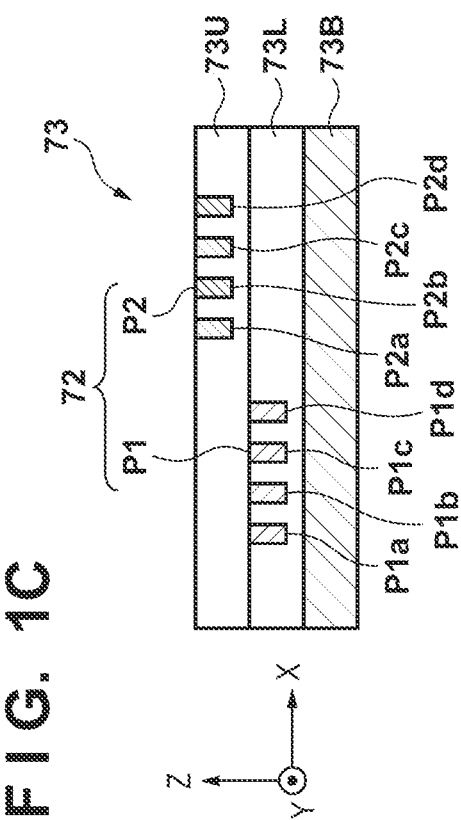
FIG. 1B
FIG. 1C

F I G. 2A
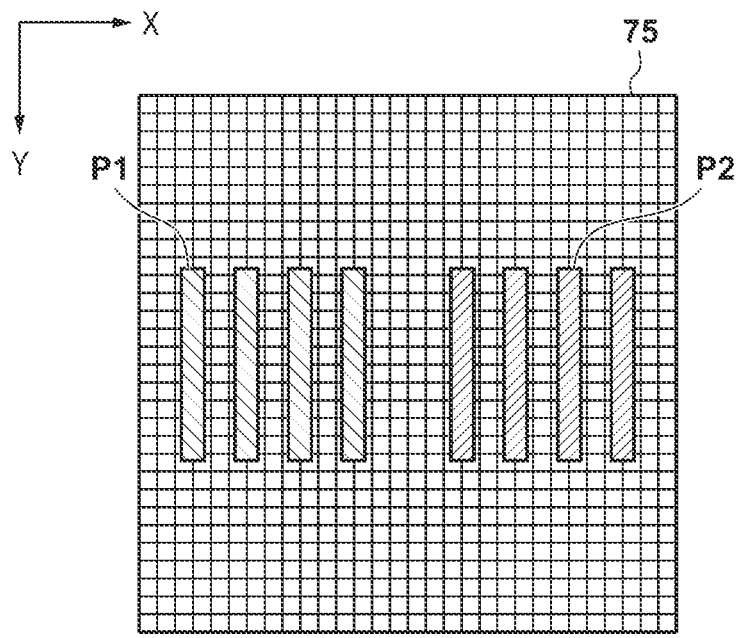
F I G. 2B
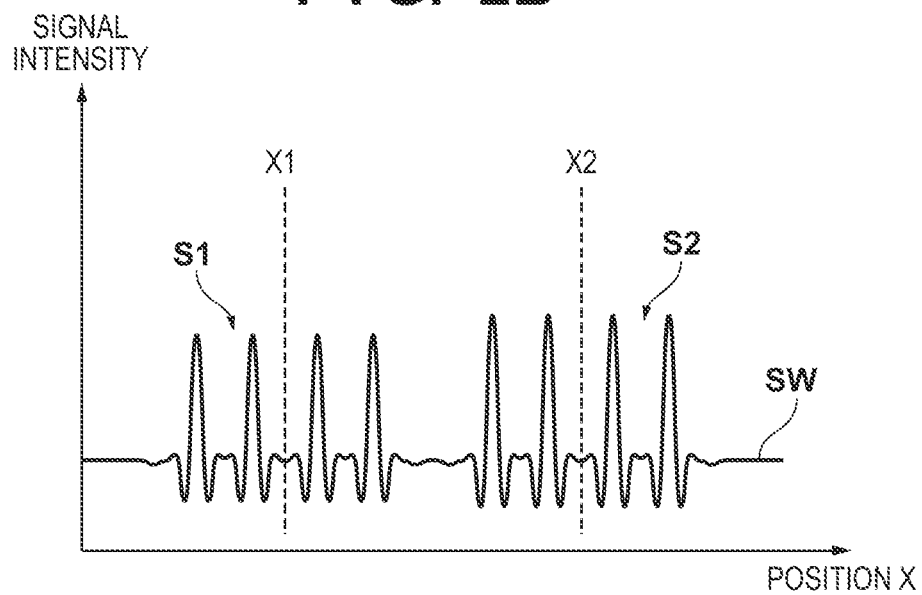

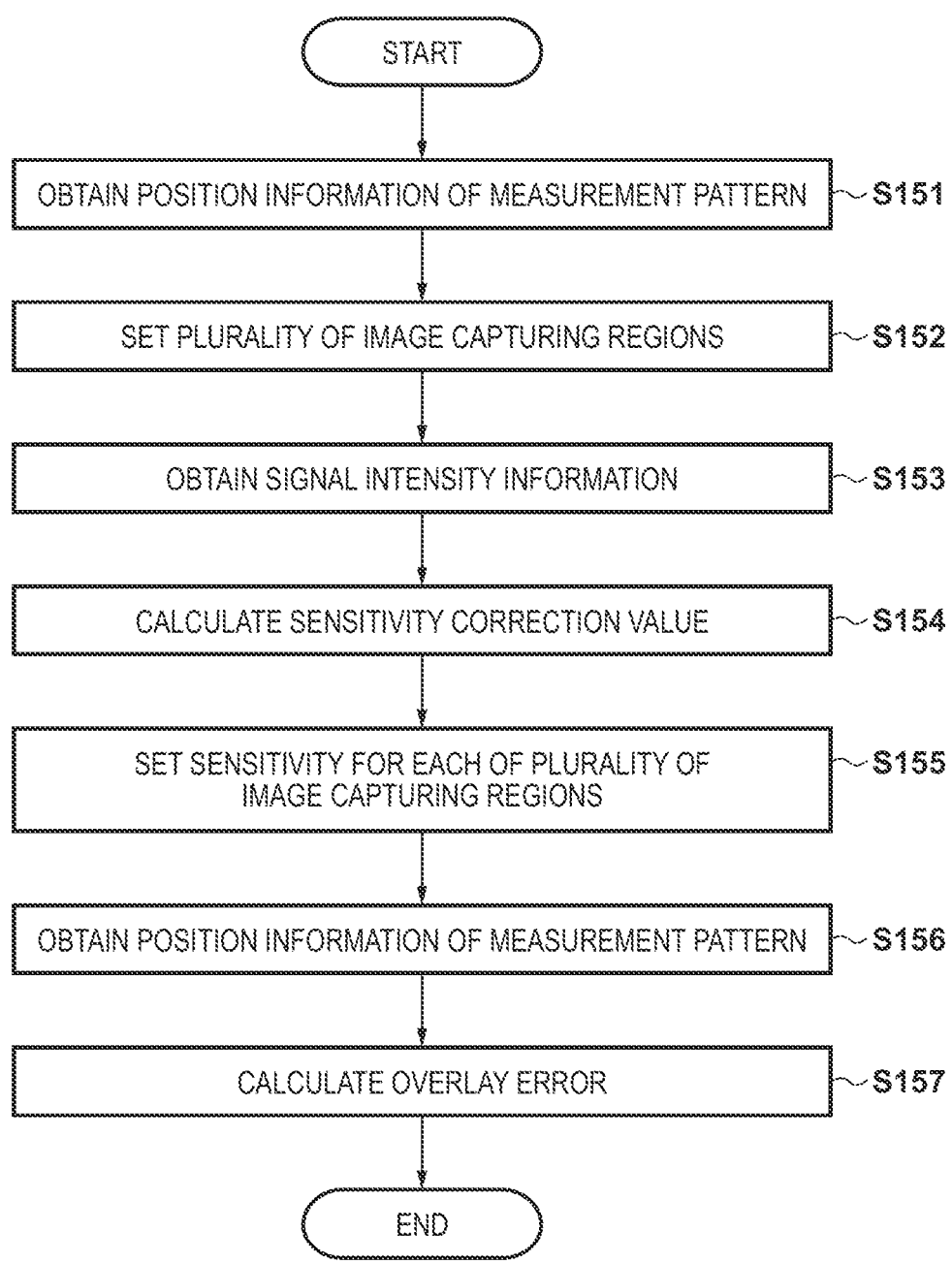

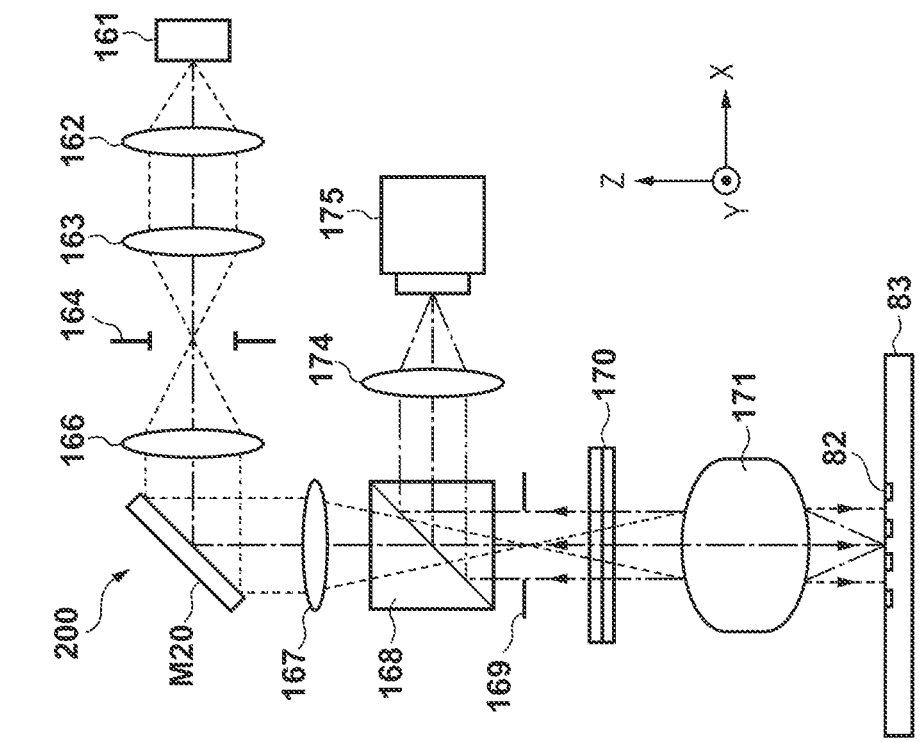
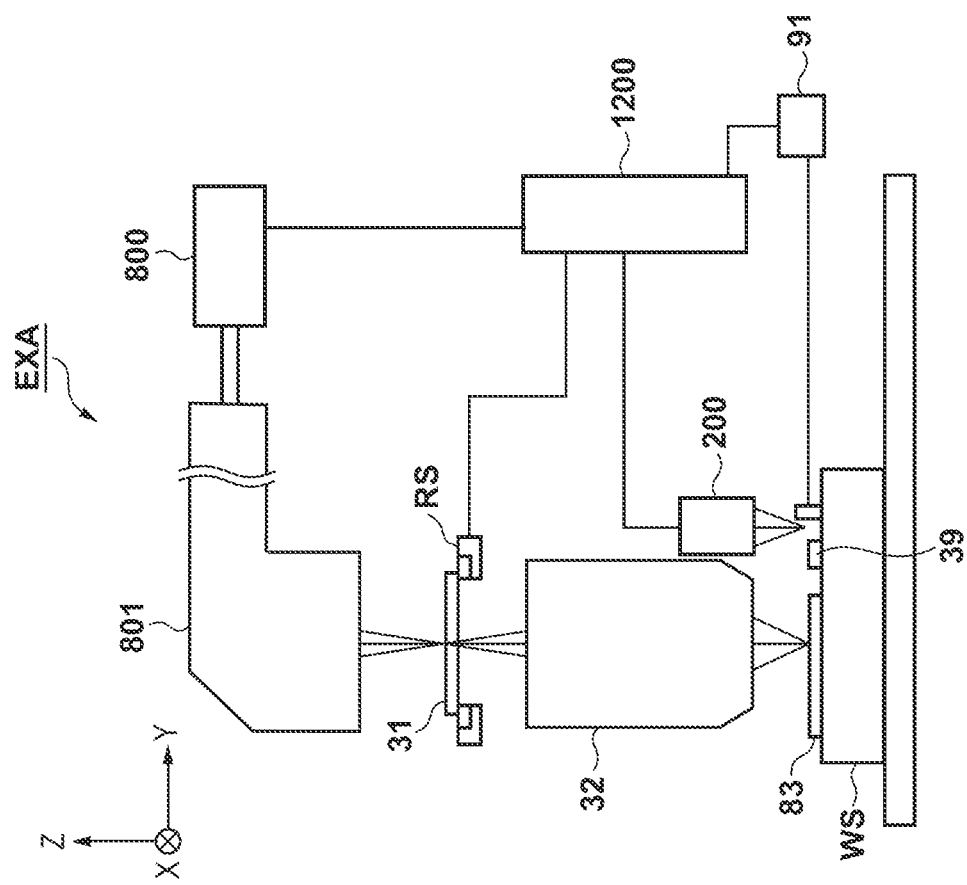
FIG. 7A
FIG. 7B

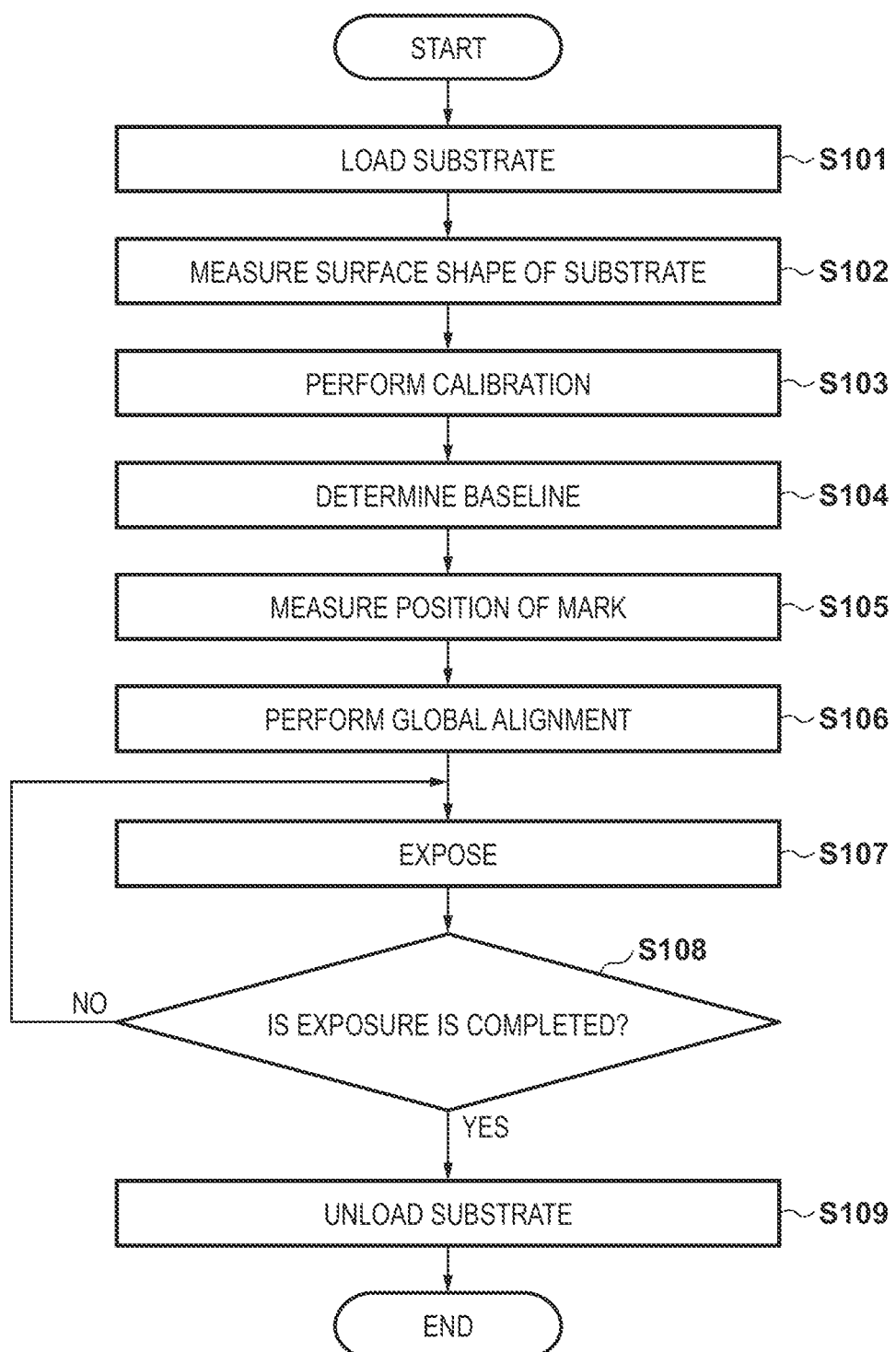

MEASUREMENT APPARATUS, LITHOGRAPHY APPARATUS AND ARTICLE MANUFACTURING METHOD

BACKGROUND OF THE INVENTION

Field of the Invention

The present invention relates to a measurement apparatus, a lithography apparatus and an article manufacturing method.

Description of the Related Art

In recent years, due to high integration and miniaturization of semiconductor integrated circuits, the line width of a pattern to be formed on a substrate has become extremely small. Therefore, further miniaturization is required in a lithography process of forming the pattern (resist pattern) on the substrate. In a step-and-repeat type exposure apparatus or a step-and-scan type exposure apparatus which is used in the lithography process, a pattern is formed on a substrate by imaging the light (exposure light) from an original at a predetermined position on the substrate through a projection optical system. Accordingly, in order to meet the demand for pattern miniaturization, it is important to align the relative positions of the original and the substrate with high accuracy. Further, along with miniaturization of a pattern, also in measurement of an overlay error between patterns formed on the substrate, it is important to measure, with high accuracy, the patterns formed in different layers on the substrate.

In an exposure apparatus, prior to exposure, global alignment is generally performed in which the positions of alignment marks provided in correspondence with shot regions on a substrate are measured and the array (lattice array) of the shot regions is obtained from the measurement result to perform alignment. As for global alignment, in order to achieve both the improvement of measurement accuracy and the reduction in measurement time, Japanese Patent No. 5550253 proposes a technique of setting a readout region in the visual field of an image sensor and measuring the position of the alignment mark.

Japanese Patent No. 5550253 discloses a technique in which the setting of the resolution and readout region in the image sensor is changed and the position of an alignment mark formed by a plurality of mark elements is measured. In this technique, mark detection with low resolution in a large range and mark detection with high resolution in a small range are sequentially performed, and this enables measurement of the alignment mark on the substrate with high speed and high accuracy.

In overlay measurement of measuring an overlay error between different layers formed on a substrate, a pattern formed in a lower layer and a pattern formed in an upper layer are simultaneously observed to measure relative positions of the patterns in the upper and lower layers. As for overlay measurement, in order to achieve both the improvement of measurement accuracy and the reduction in measurement time, Japanese Patent No. 5180419 proposes a technique of setting a processing region with respect to an output image from an image sensor and obtaining the relative position information of the patterns.

Japanese Patent No. 5180419 discloses a technique of setting a plurality of processing regions for a plurality of patterns in the output image from the image sensor. In this technique, by generating signals corresponding to the respective patterns in the plurality of processing regions, it is possible to measure, with high speed and high accuracy, the relative positions of the plurality of patterns formed in different layers on a substrate.

However, the related art has a problem that when the intensity of detection light varies between the patterns in the same layer or different layers due to a difference in reflectance in the substrate, the productivity may be degraded due to a decrease in measurement accuracy or a measurement error.

SUMMARY OF THE INVENTION

The present invention provides a measurement apparatus advantageous in measuring the position of a pattern provided in a target object.

According to one aspect of the present invention, there is provided a measurement apparatus for measuring a position of a first pattern and a position of a second pattern provided in a target object, the apparatus including an image capturing unit including a plurality of pixels which detect light from the first pattern and light from the second pattern, and configured to form an image capturing region used to capture the first pattern and the second pattern by the plurality of pixels, and a control unit configured to control the image capturing unit to obtain the position of the first pattern and the position of the second pattern based on an output from the image capturing unit, wherein the control unit sets, based on the position of the first pattern and the position of the second pattern, a first image capturing region used to capture the first pattern and a second image capturing region used to capture the second pattern in the image capturing region, and adjusts the image capturing unit such that a relative ratio of an intensity of a detection signal of the first pattern generated based on an output from the first image capturing region and an intensity of a detection signal of the second pattern generated based on an output from the second image capturing region falls within an allowable range.

Further aspects of the present invention will become apparent from the following description of exemplary embodiments with reference to the attached drawings.

BRIEF DESCRIPTION OF THE DRAWINGS

FIGS. 1A to 1C are views for explaining a measurement apparatus in the first embodiment of the present invention.

FIGS. 2A and 2B are views for explaining measurement processing of measuring an overlay error.

FIG. 5 is a flowchart for explaining the sequence of the measurement processing of measuring an overlay error in the first embodiment.

FIGS. 7A and 7B are views for explaining an exposure apparatus in the second embodiment of the present invention.

FIG. 8 is a flowchart for explaining the sequence of exposure processing of exposing a substrate.

DESCRIPTION OF THE EMBODIMENTS

Figure 3A:
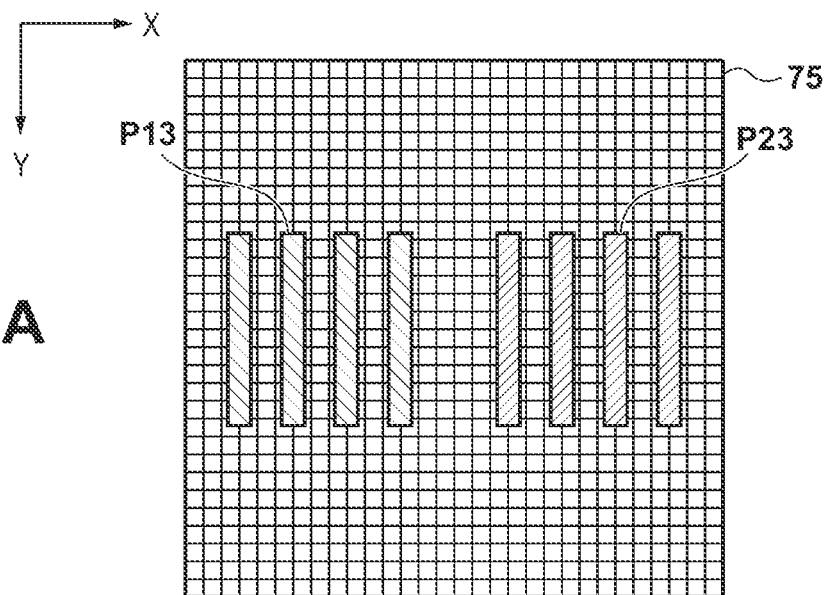
FIGS. 3A to 3C are views for explaining a problem in the related art.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1A is a schematic view showing the arrangement of a measurement apparatus 100 as one aspect of the present invention. The measurement apparatus 100 is an overlay measurement apparatus (overlay inspection apparatus) that measures an overlay error in a substrate 73, more specifically, relative positions of a plurality of patterns provided in different layers on the substrate (on the target object). As shown in FIG. 1A, the measurement apparatus 100 includes a substrate stage WS which holds the substrate 73, a measurement unit 50, and a control unit 1100.

The substrate 73 is the target object whose overlay error is measured by the measurement apparatus 100. The substrate 73 is, for example, a substrate used to manufacture a device such as a semiconductor device or a liquid crystal display device and, more specifically, includes a wafer, a liquid crystal substrate, another processing target substrate, or the like.

The substrate stage WS holds the substrate 73 via a substrate chuck (not shown), and is connected to a substrate driving mechanism (not shown). The substrate driving mechanism includes a linear motor or the like, and can move the substrate 73 held by the substrate stage WS by driving the substrate stage WS in the X-axis direction, the Y-axis direction, the Z-axis direction, and the rotation directions around the respective axes. The position of the substrate stage WS is monitored by, for example, a 6-axis laser interferometer 81 or the like, and the substrate stage WS is driven to a predetermined position under the control of the control unit 1100.

The control unit 1100 is formed by a computer (information processing apparatus) including a CPU, a memory, and the like and, for example, operates the measurement apparatus 100 by comprehensively controlling respective units of the measurement apparatus 100 in accordance with a program stored in a storage unit. In this embodiment, the control unit 1100 controls measurement processing in the measurement apparatus 100 and correction processing (calculation processing) of a measurement value obtained by the measurement apparatus 100.

With reference to FIG. 1B, the arrangement of the measurement unit 50 will be described. The measurement unit 50 includes an illumination system for illuminating the substrate 73 using the light from a light source 61, and an imaging system (detection system) for imaging the light from a measurement pattern 72 provided in the substrate 73 (forming the image of the measurement pattern 72) in an image sensor 75. The image sensor 75 includes a plurality of pixels that detect the light from the measurement pattern 72, and functions as an image capturing unit that forms an image capturing region for capturing the measurement pattern 72 using the plurality of pixels. Here, the measurement pattern 72 can be a pattern for measuring an overlay error in the substrate 73.

Referring to FIG. 1B, the light from the light source 61 is guided via illumination optical systems 62 and 63 to an illumination aperture stop 64 arranged at a position optically conjugate with the substrate 73. The light beam diameter at the illumination aperture stop 64 is smaller than the light beam diameter at the light source 61. The light having passed through the illumination aperture stop 64 is guided to a polarization beam splitter 68 via an illumination optical system 66, a mirror M2, and an illumination optical system 67. The polarization beam splitter 68 transmits P-polarized light parallel to the X direction and reflects S-polarized light parallel to the Y direction. The P-polarized light transmitted through the polarization beam splitter 68 passes through a $\lambda/4$ plate 70 via an aperture stop 69, is converted into circularly polarized light, and Koehler-illuminates the measurement pattern 72 provided in the substrate 73 via an objective optical system 71.

Note that the illumination system may be provided with a light amount adjustment unit (not shown) and a wavelength adjustment unit (not shown). For example, by controlling the light amount adjustment unit capable of switching a plurality of ND filters having different transmittances with respect to the light from the light source 61, the intensity of light illuminating the substrate 73 can be adjusted with high accuracy. Further, by controlling the wavelength adjustment unit capable of switching a plurality of wavelength filters which transmit light beams having different wavelength characteristics of the light from the light source 61, it is possible to adjust (change) the wavelength of light illuminating the substrate 73.

The light reflected, diffracted, and scattered by the measurement pattern 72 provided in the substrate 73 passes through the $\lambda/4$ plate 70 via the objective optical system 71 and is guided to the aperture stop 69. Here, the polarization state of the light from the measurement pattern 72 is circular polarization that is reverse to the circular polarization of the light illuminating the measurement pattern 72. Accordingly, when the polarization state of the light illuminating the measurement pattern 72 is clockwise circular polarization, the polarization state of the light from the measurement pattern 72 is counterclockwise circular polarization. The light having passed through the $\lambda/4$ plate 70 and converted from circular polarization into S-polarization passes through the aperture stop 69, is reflected by the polarization beam splitter 68, and is guided to the image sensor 75 via an imaging optical system 74.

In this manner, in the measurement unit 50, the polarization beam splitter 68 separates the optical path of the light illuminating the substrate 73 and the optical path of the light from the substrate 73, and the image of the measurement pattern 72 provided in the substrate 73 is formed in the image sensor 75. Based on the position information of the substrate stage WS obtained by the laser interferometer 81 and the waveform of a detection signal obtained by detecting the image of the measurement pattern 72, the control unit 1100 obtains the position of the pattern element forming the measurement pattern 72 and the position of the measurement pattern 72.

Note that in the imaging system of the measurement unit 50, a detection aperture stop may be formed by arranging a plurality of lenses between the polarization beam splitter 68 and the image sensor 75. Further, a plurality of aperture stops which enable setting of different numerical apertures with respect to the illumination system and the imaging system may be provided in each of the illumination aperture stop 64 and the detection aperture stop, and the plurality of aperture stops may be switchable. With this, it is possible to adjust the σ value which is a coefficient representing the ratio of the numerical aperture of the illumination system and the numerical aperture of the imaging system.

FIG. 1C is a view showing an example of the arrangement of the measurement pattern 72 provided in the substrate 73. In this embodiment, the substrate 73 is a substrate formed by three layers of a lowermost layer 73B, a first layer 73L, and a second layer 73U. The measurement pattern 72 is formed by a first pattern P1 provided in the first layer 73L and a second pattern P2 provided in the second layer 73U. The first pattern P1 includes four pattern elements P1$a$, P1$b$, P1$c$, and P1$d$, and the second pattern P2 includes four pattern elements P2$a$, P2$b$, P2$c$, and P2$d$.

The measurement apparatus 100 detects, by the image sensor 75 (measurement unit 50), the light (reflected light and scattered light) from the measurement pattern 72, more specifically, each of the first pattern P1 and the second pattern P2. As a method of detecting the light from the measurement pattern 72, for example, dark field detection may be used in which the illumination aperture stop 64 and the detection aperture stop (the numerical apertures of the illumination system and the imaging system) are controlled to block the 0-order diffracted light from the measurement pattern 72 and detect only the higher-order diffracted light and scattered light.

With reference to FIGS. 2A and 2B, as a general operation of the measurement apparatus 100, measurement processing of measuring an overlay error in the substrate 73, that is, measurement processing of measuring the relative position between the first pattern P1 and the second pattern P2 forming the measurement pattern 72 will be described.

FIG. 2A is a view showing the image of the measurement pattern 72 formed on the image capturing region (image capturing surface or detection surface) of the image sensor 75 shown in FIG. 1B. A two-dimensional image sensor including the image capturing region formed by a plurality of pixels arrayed in the X direction and the Y direction is used as the image sensor 75. Based on an output (captured image) from the image sensor 75, the control unit 1100 generates a detection signal including the waveforms corresponding to the first pattern P1 and the second pattern P2.

FIG. 2B is a view showing an example of a detection signal SW generated based on the captured image obtained by capturing the image of the measurement pattern 72 shown in FIG. 2A by the image sensor 75. The detection signal SW is generated by integrating the signal intensities of the respective pixels of the image sensor 75 in the Y direction in the captured image including the image of the measurement pattern 72 shown in FIG. 2A. Note that regarding the integration of the signal intensities of the respective pixels of the image sensor 75, the number of pixels to be integrated is preferably set based on the dimension information of the measurement pattern 72.

Referring to FIG. 2B, a waveform S1 included in the detection signal SW corresponds to the signal intensity (change thereof) of the first pattern P1, and a waveform S2 included in the detection signal SW corresponds to the signal intensity (change thereof) of the second pattern P2. The control unit 1100 obtains a measurement value X1 indicating the central position of the first pattern P1 from the waveform S1, and obtains a measurement value X2 indicating the central position of the second pattern P2 from the waveform S2. Then, for example, by obtaining the difference between the measurement value X1 and the measurement value X2, the relative positional shift between the first pattern P1 and the second pattern P2 in the X direction is obtained.

Note that in a case in which the relative positional shift in the Y direction is measured as the overlay error, a measurement pattern may be used that is formed by the first pattern and the second pattern each including a plurality of pattern elements whose longitudinal directions match the X direction and which are arrayed along the Y direction. Then, a detection signal of a captured image including the image of this measurement pattern is generated by integrating the signal intensities of the respective pixels in the X direction, and the relative positional shift in the Y direction is obtained from the difference between the measurement value of the first pattern and the measurement value of the second pattern.

Here, if the reflectance difference is large between the first layer 73L and the second layer 73U in the substrate 73, a difference occurs between the light intensity (the intensity of the detection light) corresponding to the first pattern P1 and the light intensity corresponding to the second pattern P2 detected by the image sensor 75. A problem in the related art that occurs when there is a difference between the light intensity corresponding to the first pattern P1 and the light intensity corresponding to the second pattern P2, more specifically, a degradation in productivity caused by a decrease in measurement accuracy or a measurement error will be described below.

Figure 3B:
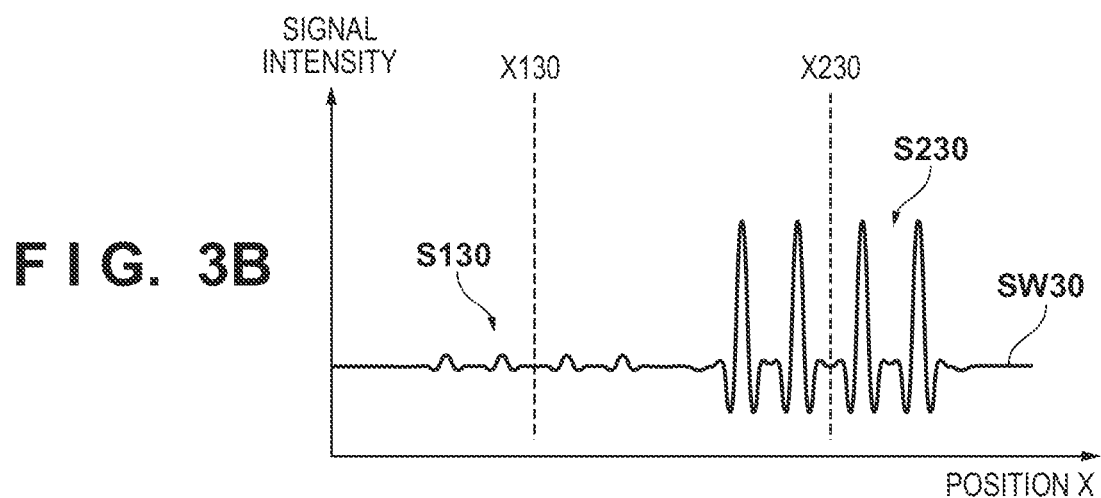

FIG. 3A is a view showing the image of the measurement pattern 72, more specifically, an image P13 of the first pattern P1 and an image P23 of the second pattern P2, formed on the image capturing region of the image sensor 75 when the reflectance difference is large between the first layer 73L and the second layer 73U. FIG. 3B is a view showing an example of a detection signal SW30 generated based on the captured image obtained by capturing the image of the measurement pattern 72 shown in in FIG. 3A by the image sensor 75.

Referring to FIG. 3B, a waveform S130 included in the detection signal SW30 corresponds to the signal intensity (change thereof) of the first pattern P1, and a waveform S230 included in the detection signal SW30 corresponds to the signal intensity (change thereof) of the second pattern P2. As shown in FIG. 3B, when the reflectance difference is large between the first layer 73L and the second layer 73U and the signal intensity (waveform S130) of the first pattern P1 is low, the waveform S130 has relatively higher electrical noise with respect to the signal intensity than in the waveform S230. In such a case, it is possible to obtain a measurement value X230 indicating the central position of the second pattern P2 from the waveform S230 with high accuracy, but it is difficult to obtain a measurement value X130 indicating the central position of the first pattern P1 from the waveform S130 with high accuracy.

Figure 3C:
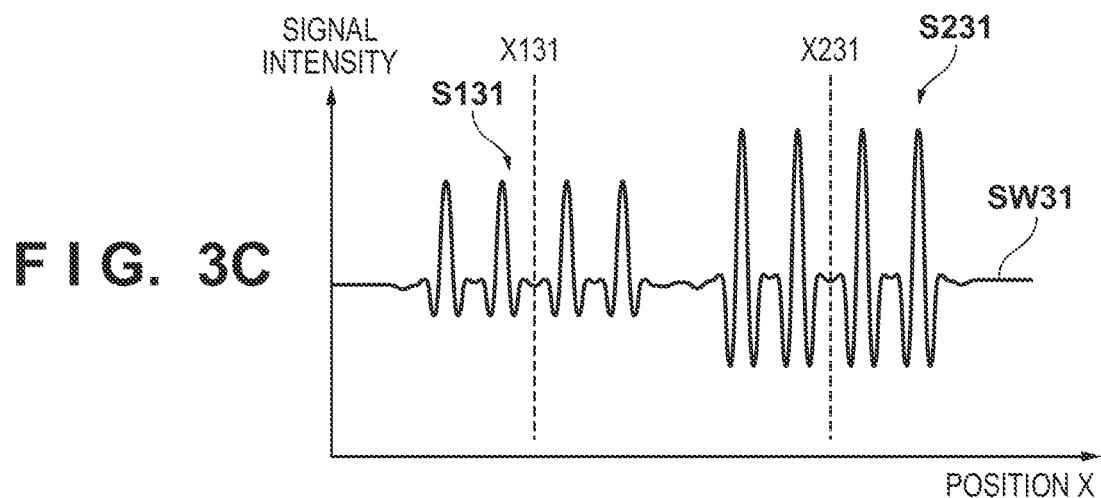

FIG. 3C is a view showing an example of a detection signal SW31 generated based on the captured image obtained by capturing the image of the measurement pattern 72 by the image sensor 75 when the light amount of the light illuminating the measurement pattern 72 is increased to increase the signal intensity of the first pattern P1. Referring to FIG. 3C, a waveform S131 included in the detection signal SW31 corresponds to the signal intensity (change thereof) of the first pattern P1, and a waveform S231 included in the detection signal SW31 corresponds to the signal intensity (change thereof) of the second pattern P2.

Note that in the measurement apparatus 100, it is possible to adjust the signal intensity from the measurement pattern 72 by controlling an output from the light amount adjustment unit (ND filters) or the light source 61 provided in the illumination system of the measurement unit 50 or controlling the accumulation time of the image sensor 75. If the signal intensity in the observation visual field of the image sensor 75, that is, in the entire image capturing region is increased, the signal intensity in the waveform S131 becomes higher than the signal intensity in the waveform S130, but the signal intensity in the waveform S231 is also increased. With this, if the signal intensity in the waveform S231 exceeds the level detectable by the image sensor 75, for example, reaches the saturation level, it is difficult to obtain the measurement value X230 indicating the central position of the second pattern P2 from the waveform S231 with high accuracy.

It is also conceivable in the measurement apparatus 100 that measurement is performed a plurality of times while changing the light amount of the light illuminating the measurement pattern 72, and the waveform S131 and the waveform S230 are obtained from the first pattern P1 and the second pattern P2, respectively. With this, the signal intensity in each of the waveforms S131 and S230 does not reach the saturation level of the image sensor 75. Accordingly, it is possible to obtain the measurement value X130 indicating the central position of the first pattern P1 from the waveform S131 with high accuracy, and obtain the measurement value X230 indicating the central position of the second pattern P2 from the waveform S231 with high accuracy. However, in this case, since it is necessary to perform the measurement a plurality of times while changing the light amount of the light illuminating the measurement pattern 72, the productivity may be degraded due to an increase in measurement time or the measurement accuracy may be decreased due to the elapse of time (change over time).

Therefore, in this embodiment, a technique is proposed in which it is possible to obtain, with high accuracy, the measurement values indicating the central positions of the first pattern P1 and the second pattern P2, respectively, even when the reflectance difference is large between the first layer 73L and the second layer 73U. More specifically, based on the position of the measurement pattern 72, at least two different image capturing regions, for example, a first image capturing region for capturing the first pattern P1 and a second image capturing region for capturing the second pattern P2 are set in the image capturing region of the image sensor 75. Further, the image sensor 75 is adjusted such that the relative ratio of the intensity of the detection signal of the first pattern P1 generated based on an output from the first image capturing region and the intensity of the detection signal of the second pattern P2 generated based on an output from the second image capturing region falls within an allowable range. As adjustment of the image sensor 75, for example, the sensitivity of each of the plurality of pixels of the image sensor 75 is set. Then, based on outputs from the image sensor 75 with different sensitivities set therein, the relative position (overlay error) between the first pattern P1 and the second pattern P2 is obtained as the positions of the first pattern P1 and the second pattern P2.

Figure 4A:
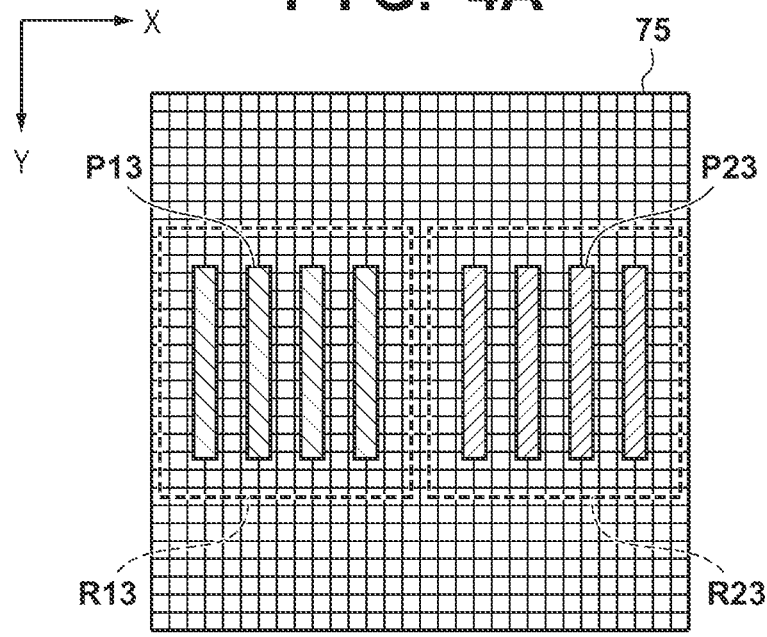
FIGS. 4A and 4B are views for explaining measurement processing of measuring an overlay error in the first embodiment.
Figure 4B:
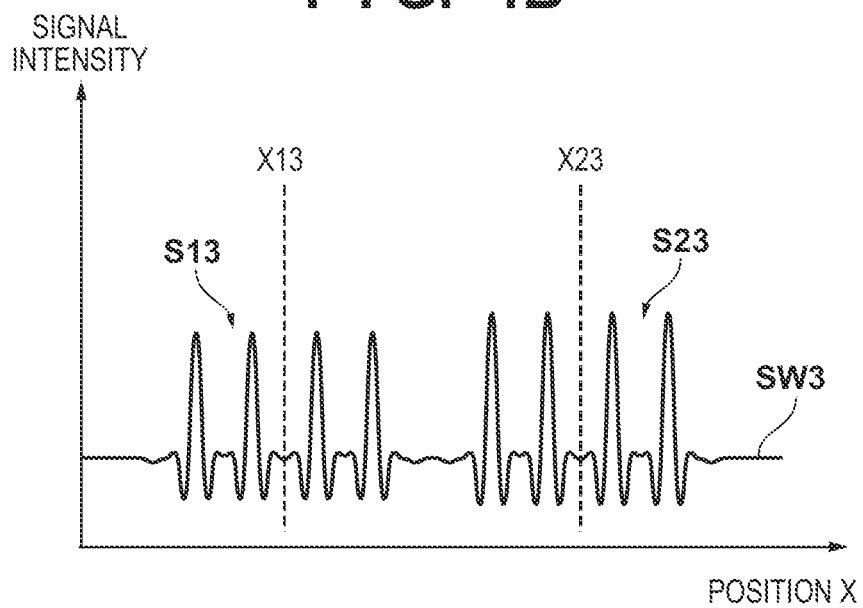

With reference to FIGS. 4A and 4B, measurement processing of measuring an overlay error in the substrate 73 in this embodiment, that is, measurement processing of measuring the relative position between the first pattern P1 and the second pattern P2 forming the measurement pattern 72 will be described. FIG. 4A is a view showing the image of the measurement pattern 72, more specifically, the image P13 of the first pattern P1 and the image P23 of the second pattern P2, formed on the image capturing region of the image sensor 75 when the reflectance difference is large between the first layer 73L and the second layer 73U. Based on the position of the measurement pattern 72, as shown in FIG. 4A, the control unit 1100 sets, in the image capturing region of the image sensor 75, a first image capturing region R13 so as to include the image P13 of the first pattern P1 and a second image capturing region R23 so as to include the image P23 of the second pattern P2. Then, the control unit 1100 obtains the signal intensity of the first pattern P1 generated based on an output from the first image capturing region R13 and the signal intensity of the second pattern P2 generated based on an output from the second image capturing region R23. Then, the control unit 1100 obtains a sensitivity correction value for each of the plurality of pixels of the image sensor 75, more specifically, for each of the first image capturing region R13 and the second image capturing region R23 such that the relative ratio of the signal intensity of the first pattern P1 and the signal intensity of the second pattern P2 falls within an allowable range. The control unit 1100 sets different sensitivities for the first image capturing region R13 and the second image capturing region R23 of the image sensor 75 based on the respective sensitivity correction values.

FIG. 4B is a view showing an example of a detection signal SW3 generated based on a captured image obtained by capturing the image of the measurement pattern 72 shown in FIG. 4A by the image sensor 75 in which the different sensitivities are set for the first image capturing region R13 and the second image capturing region R23. Referring to FIG. 4B, a waveform S13 included in the detection signal SW3 corresponds to the signal intensity (change thereof) of the first pattern P1, and a waveform S23 included in the detection signal SW3 corresponds to the signal intensity (change thereof) of the second pattern P2. In this embodiment, the higher sensitivity is set for the pixels included in the first image capturing region R13 than for the pixels included in the second image capturing region R23, so that it becomes possible to avoid a decrease of the signal intensity in the waveform S13 and saturation of the signal intensity in the waveform S23. Accordingly, it is possible to obtain a measurement value X13 indicating the central position of the first pattern P1 from the waveform S13 with high accuracy, and obtain a measurement value X23 indicating the central position of the second pattern P2 from the waveform S23 with high accuracy.

There is a difference between the increase rate of the signal intensity and that of noise with respect to an increase in sensitivity of the image sensor. More specifically, the signal intensity increases proportional to an increase in the sensitivity of the image sensor but, as for noise, the noise amplification changes in accordance with the set value of the sensitivity of the image sensor. This is because shot noise, which is not influenced by the sensitivity of the image sensor, is included. In general, noise N is expressed by following expression (1) using readout noise Nr and dark current noise Nd which change in accordance with the sensitivity of the image sensor and shot noise Ns which is not influenced by the sensitivity of the image sensor:

$$N = Nr^2 + Nd^2 + Ns^2 \qquad (1)$$

Therefore, by setting the sensitivity of the image sensor so as to avoid a decrease in measurement accuracy due to an increase of noise while achieving the signal intensity (level) detectable by the image sensor, it is possible to obtain a measurement value X13 with high accuracy compared to the measurement value X130.

With reference to FIG. 5, the sequence of measurement processing of measuring an overlay error, that is, the relative position between the first pattern P1 and the second pattern P2 forming the measurement pattern 72 in this embodiment will be described. As has been described above, the measurement processing is performed by the control unit 1100 comprehensively controlling the respective units of the measurement apparatus 100.

If the measurement processing of measuring an overlay error is started, first, the substrate stage WS holding the substrate 73 is positioned such that the image of the measurement pattern 72 is formed in the image capturing region of the image sensor 75 of the measurement unit 50. As for the Z-direction position of the substrate 73 with respect to the measurement unit 50, for example, the signal intensity of at least one pattern forming the measurement pattern 72 is obtained, and the substrate stage WS holding the substrate 73 may be positioned such that the signal intensity or a change thereof becomes equal to or larger than a target value. Alternatively, the signal intensities of the first pattern P1 and the second pattern P2 forming the measurement pattern 72 may be obtained, and the substrate stage WS holding the substrate 73 may be positioned such that both of the signal intensities or changes thereof become equal to or higher than a target value.

In step S151, information (positional information) regarding the position of the measurement pattern 72 provided in the substrate 73 is obtained. In this embodiment, the positional information of the measurement pattern 72 is obtained by performing rough measurement of the position of the measurement pattern 72 provided in the substrate 73. Note that the rough measurement in step S151 is performed with lower resolution in a larger measurement range than in precise measurement in step S156 to be described later. Therefore, the rough measurement in step S151 and the precise measurement in step S156 are defined as follows. The rough measurement in step S151 is measurement processing (first measurement processing) of measuring the position of the measurement pattern 72 with first resolution in a first measurement range. The precise measurement in step S156 is measurement processing (second measurement processing) of measuring the position of the measurement pattern 72 with second resolution higher than the first resolution in a second measurement range smaller than the first measurement range. Here, the resolution of the positional information means the size of the pixel with respect to the image capturing region of the image sensor 75 on the substrate or the tone of the image obtained by the image sensor 75. In the rough measurement, the positional information of the measurement pattern 72 can be obtained while suppressing an increase in transfer time in the image sensor 75 and an increase in calculation processing time in the control unit 1100.

More specifically, in step S151, the position of the measurement pattern 72 is obtained by obtaining the change of the signal intensity of the measurement pattern 72 based on the captured image obtained by capturing the image of the measurement pattern 72 by the image sensor 75, that is, the captured image obtained by the rough measurement. Alternatively, the position of the measurement pattern 72 may be obtained based on the captured image obtained by the rough measurement and the set value of the measurement pattern 72 registered in advance. Further, as another method, the position of the measurement pattern 72 may be obtained based on the position of the substrate 73 upon conveyance onto the substrate stage WS which is obtained by a substrate position measurement apparatus (not shown) different from the measurement unit 50 (measurement apparatus 100).

Further, in step S151, in addition to the rough measurement of the position of the measurement pattern 72, the wavelength or σ value of the light illuminating the measurement pattern 72 may be adjusted to a set value suitable for the precise measurement in step S155, that is, a set value that enables highly-precise measurement of the position of the measurement pattern 72. Note that the set value regarding the wavelength or σ value of the light illuminating the measurement pattern 72 may be determined in advance based on, for example, the measurement result of the measurement pattern 72 or information regarding the structure or physical characteristic value of the substrate 73.

In step S152, based on the positional information of the measurement pattern 72 obtained in step S151, a plurality of image capturing regions different from each other are set in the image capturing region of the image sensor 75. More specifically, based on the positional information of the measurement pattern 72 in the image capturing region of the image sensor 75, the image capturing region is set for each of the first pattern P1 and the second pattern P2. For example, as shown in FIG. 4A, in the image capturing region of the image sensor 75, the first image capturing region R13 is set so as to include the image P13 of the first pattern P1, and the second image capturing region R23 is set so as to include the image P23 of the second pattern P2.

In the image capturing region of the image sensor 75, the plurality of image capturing regions different from each other are set based on the lengths of the measurement target pattern in the measurement direction and non-measurement direction. For example, by setting the image capturing region larger than the length in the measurement direction of the pattern formed by the plurality of pattern elements, the signal intensity in the pattern region including the pattern and the signal intensity in the non-pattern region including no pattern may be obtained. Further, by setting the image capturing region equal to or larger than the length of the pattern in the non-measurement direction, the signal intensity of the pattern in the non-measurement direction may be obtained. With this, it becomes possible to set the sensitivity of the image capturing region of the image sensor 75 to the position of the pattern with high accuracy. Note that the measurement direction of the pattern is the direction in which the pattern elements forming the pattern are arrayed, and the non-measurement direction of the pattern is the direction orthogonal to the array direction of the pattern elements forming the pattern. For example, in the measurement pattern 72 including the first pattern P1 and the second pattern P2, the X direction in which the pattern elements P1$a$ to P1$d$ and P2$a$ to P2$d$ are arrayed is the measurement direction, and the Y direction orthogonal to the X direction is the non-measurement direction.

In step S153, information (signal intensity information) regarding the signal intensity in each of the plurality of image capturing regions different from each other set in the image sensor 75 in step S152 is obtained. More specifically, the signal intensity information indicating the signal intensity (change thereof) of the first pattern P1 is obtained based on an output from the first image capturing region R13. Similarly, the signal intensity information indicating the signal intensity (change thereof) of the second pattern P2 is obtained based on an output from the second image capturing region R23. Note that the signal intensity information may be the maximum value or average value of the signal intensity of each of the first pattern P1 and the second pattern P2 in the detection signal generated based on outputs from the image sensor 75. An example of the method of obtaining the signal intensity information from the captured image obtained by the image sensor 75 is a method of, for the first pattern P1, averaging the signal intensities at respective pixels in the Y direction serving as the non-measurement direction and obtaining the change of the signal intensity in the X direction serving as the measurement direction. With the method as described above, the signal intensity information of the first pattern P1 and the second pattern P2 can be obtained based on outputs from the first image capturing region R13 and the second image capturing region R23, respectively.

In step S154, based on the signal intensity information in each of the plurality of image capturing regions (the first image capturing region R13 and the second image capturing region R23) of the image sensor 75 different from each other obtained in step S153, the sensitivity correction value for each of the plurality of image capturing regions is calculated. Note that the specific calculation method of the sensitivity correction value will be described later in detail.

In step S155, for each of the plurality of image capturing regions (the first image capturing region R13 and the second image capturing region R23) of the image sensor 75 different from each other, the sensitivity is set based on the sensitivity correction value calculated in step S154. For example, assuming that the sensitivity set in the image sensor as default is the first sensitivity, the second sensitivity expressed by a product of the first sensitivity and the sensitivity correction value is set for each of the plurality of image capturing regions of the image sensor 75 different from each other.

In step S156, using the image sensor 75 in which the sensitivities are set for the plurality of image capturing regions different from each other in step S155, the positional information of the measurement pattern 72 provided in the substrate 73 is obtained. In this embodiment, the positional information of the measurement pattern 72 is obtained by performing precise measurement of the position of the measurement pattern 72 provided in the substrate 73. The precise measurement in step S156 is performed with higher resolution in a smaller region (that is, the measurement range is limited to a predetermined range) than in the rough measurement in step S151. More specifically, the detection signal SW3 is generated based on the captured image obtained by capturing the image of the measurement pattern 72 by the image sensor 75 in which different sensitivities are set for the first image capturing region R13 and the second image capturing region R23. Then, from the detection signal SW3, the waveform S13 corresponding to the signal intensity (change thereof) of the first pattern P1 and the waveform S23 corresponding to the signal intensity (change thereof) of the second pattern P2 are extracted. Note that the detection signal may be generated for each of the first image capturing region R13 and the second image capturing region R23, and the waveform corresponding to the signal intensity of the first pattern P1 and the waveform corresponding to the signal intensity of the second pattern P2 may be obtained from the respective detection signals.

In step S157, an overlay error is calculated based on the positional information of the measurement pattern 72 obtained in step S156. More specifically, the measurement value X13 indicating the central position of the first pattern P1 is obtained from the waveform S13, and the measurement value X23 indicating the central position of the second pattern P2 is obtained from the waveform S23. Then, the relative position (shift) between the first pattern P1 and the second pattern P2, which is the difference between the measurement value X13 and the measurement value X23, is obtained as the overlay error.

Figure 6A:
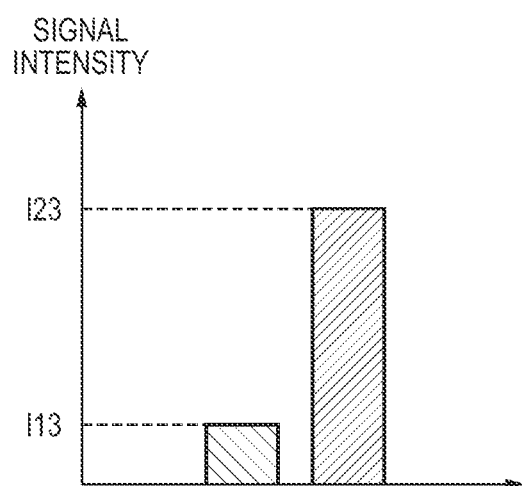
FIGS. 6A and 6B are views for explaining a specific calculation method of a sensitivity correction value performed in step S154 shown in FIG. 5.
Figure 6B:
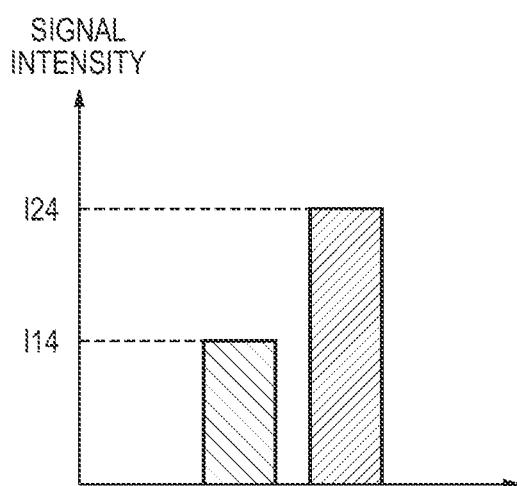

With reference to FIGS. 6A and 6B, the specific calculation method of the sensitivity correction value in step S154 will be described. FIG. 6A is a view showing the signal intensities of the first pattern P1 and the second pattern P2 obtained by the image sensor 75 before setting the sensitivities for the plurality of image capturing regions different from each other in step S155. In FIG. 6A, I13 indicates the signal intensity of the first pattern P1, and I23 indicates the signal intensity of the second pattern P2. Here, a case will be described in which the signal intensity ratio (Brightness) of the signal intensity I13 to the maximum detection light amount of the image sensor 75 is 20%, and that of the signal intensity I23 is 80%. In this case, from the ratio of the lower signal intensity I13 to the higher signal intensity I23, the relative ratio of the signal intensity of the first pattern P1 and the signal intensity of the second pattern P2 is calculated to be 0.25. Here, if the allowable range of the relative ratio of the signal intensities is set to be from 0.5 (inclusive) to 1.0 (inclusive), the relative ratio of the signal intensity I13 and the signal intensity I23 does not fall within the allowable range.

Therefore, in this embodiment, so as to make the relative ratio of the signal intensity of the first pattern P1 and the signal intensity of the second pattern P2 fall within the allowable range, the sensitivity correction value for each of the first image capturing region R13 and the second image capturing region R23 is calculated. More specifically, based on the higher signal intensity I23 and a target value with which the relative ratio of the signal intensities falls within the allowable range, the sensitivity correction value for the lower signal intensity I13 is calculated. For example, from a product of the signal intensity I23 (80%) and the target value (for example, 0.5) of the relative ratio of the signal intensities, the target value of the signal intensity of the first pattern P1 is calculated to be 40%. Thus, from the quotient between the target value (40%) of the signal intensity of the first pattern P1 and the signal intensity I13 (20%), the sensitivity correction value for the first image capturing region R13 is calculated to be 2.0. Further, for the second image capturing region R23, similar to the first image capturing region R13, the sensitivity correction value is calculated so as to make the relative ratio of the signal intensities fall within the allowable range. Note that if the signal intensity ratio to the maximum detection light amount of the image sensor 75 is not changed, the sensitivity correction value for the second image capturing region R23 is calculated to be 1.0.

Based on the sensitivity correction values calculated as described above, the sensitivities are individually set for the first image capturing region R13 and the second image capturing region R23 in the image sensor 75. For example, consider a case in which both of the sensitivity of the first image capturing region R13 and the sensitivity of the second image capturing region R23 in the image sensor 75 upon obtaining the signal intensities I13 and I23 shown in FIG. 6A are 1.0. In this case, based on the product of the sensitivity and the sensitivity correction value described above, the sensitivity of the first image capturing region R13 is set to 2.0, and the sensitivity of the second image capturing region R23 is set to 1.0.

FIG. 6B is a view showing the signal intensities of the first pattern P1 and the second pattern P2 obtained by the image sensor 75 after setting the sensitivities for the plurality of image capturing regions different from each other in step S155. In FIG. 6B, I14 indicates the signal intensity of the first pattern P1, and I24 indicates the signal intensity of the second pattern P2. Since the sensitivity of the first image capturing region R13 is set to 2.0 and the sensitivity of the second image capturing region R23 is set to 1.0, the signal intensity I14 and the signal intensity I23 are equal as shown in FIGS. 6A and 6B. Further, the relative ratio of the signal intensity I14 and the signal intensity I24 is increased to 0.5 from the relative ratio of 0.25 of the signal intensity I13 and the signal intensity I23 shown in FIG. 6A. Accordingly, the relative ratio of the signal intensity I14 and the signal intensity I24 falls within the allowable range (from 0.5 (inclusive) to 1.0 (inclusive)), so that it becomes possible to obtain the relative position between the first pattern P1 and the second pattern P2 with high accuracy.

Note that the sensitivity of each of the plurality of image capturing regions different from each other in the image sensor 75 is preferably set by adjusting the digital gain of the image sensor 75. For example, if the sensitivity is set by adjusting the accumulation time of the image sensor 75, due to a difference in accumulation time, an error generated due to a positional change of the substrate stage WS may be included in the measurement value of each of the first pattern P1 and the second pattern P2. This causes a decrease in measurement accuracy of the relative position between the first pattern P1 and the second pattern P2.

Among the plurality of image capturing regions different from each other in the image sensor 75, the digital gain (sensitivity) set in at least one image capturing region is preferably 1. This is because as the value of the sensitivity set in the image sensor 75 increases, the measurement accuracy may decrease due to an increase of noise.

In order to set the digital gain set in at least one image capturing region to 1 among the plurality of image capturing regions different from each other in the image sensor 75, the signal intensity information may be obtained in step S153 in a state in which the sensitivity of the image sensor 75 is set to 1. For example, by adjusting the light amount in the illumination system of the measurement unit 50, controlling the output of the light source 61, controlling the accumulation time of the image sensor 75, or the like, the signal intensity of the second pattern P2, whose signal intensity ratio to the maximum detection light amount of the image sensor 75 is higher, is set to a level detectable by the image sensor 75. Then, in step S155, the sensitivity is set for each of the plurality of image capturing regions different from each other in the image sensor 75 based on the sensitivity correction value calculated in step S154. At this time, the sensitivity correction value for the second image capturing region R23 corresponding to the second pattern P2 is set to 1.0, thereby amplifying the signal intensity of the first pattern P1 whose signal intensity ratio to the maximum detection light amount of the image sensor 75 is lower. As a result, the sensitivity of the second image capturing region R23 corresponding to the second pattern P2 can be set to 1, so that it becomes possible to obtain the relative position between the first pattern P1 and the second pattern P2 with high accuracy while avoiding a decrease in measurement accuracy caused by an increase of noise.

In this embodiment, the measurement processing of measuring the relative position between the first pattern P1 and the second pattern P2 in the measurement apparatus 100 has been described, but the present invention is not limited to this. For example, in the measurement apparatus 100, it is also possible to measure the relative position among three or more different patterns. More specifically, the first image capturing region, the second image capturing region, and the third image capturing region are set for the first pattern, the second pattern, and the third pattern, respectively. Then, based on the signal intensities obtained from the first image capturing region, the second image capturing region, and the third image capturing region, the sensitivity correction values for the first image capturing region, the second image capturing region, and the third image capturing region are respectively calculated. For the first image capturing region, the second image capturing region, and the third image capturing region, the sensitivities are individually set based on the sensitivity correction values. With this, it is possible to obtain the relative position (shift) among the first pattern, the second pattern, and the third pattern with high accuracy.

According to this embodiment, even when there is a difference in intensity of the detection light between the patterns in different layers on the substrate, by setting different sensitivities for a plurality of image capturing regions corresponding to the respective patterns, it is possible to measure the relative position between the patterns with high speed and high accuracy. Further, by not setting different accumulation times but setting different sensitivity values for the pixels in the image sensor, it is possible to avoid a degradation in productivity caused by a plurality of times of measurement. Furthermore, even when the intensity of the detection light differs between the plurality of patterns, by setting different sensitivities not in the captured image output from the image sensor but for the pixels of the image sensor, it is possible to avoid a decrease in measurement accuracy and measure the relative position among the plurality of patterns with high accuracy. Accordingly, it is possible to provide a measurement apparatus capable of measuring the relative position among a plurality of patterns on a substrate with high speed and high accuracy.

Second Embodiment

FIG. 7A is a schematic view showing the arrangement of an exposure apparatus EXA. The exposure apparatus EXA is a lithography apparatus which is used in a lithography process as a manufacturing process of a device such as a semiconductor device or a liquid crystal display device and forms a pattern on a substrate 83. The exposure apparatus EXA exposes the substrate 83 via a reticle 31 serving as an original, thereby transferring the pattern of the reticle 31 to the substrate 83. In this embodiment, the exposure apparatus EXA employs a step-and-scan method, but it can also employ a step-and-repeat method or other exposure methods.

As shown in FIG. 7A, the exposure apparatus EXA includes an illumination optical system 801, a reticle stage RS which holds the reticle 31, a projection optical system 32, a substrate stage WS which holds the substrate 83, a position measurement apparatus 200, and a control unit 1200.

The illumination optical system 801 is an optical system that illuminates an illuminated surface using light from a light source unit 800. The light source unit 800 includes, for example, a laser. The laser includes an Arf excimer laser having a wavelength of about 193 nm, a KrF excimer laser having a wavelength of about 248 nm, or the like, but the type of light source is not limited to the excimer laser. For example, the light source unit 800 may use, as the light source, an $F_2$ laser having a wavelength of about 157 nm or EUV (Extreme Ultraviolet) having a wavelength of 20 nm or less.

In this embodiment, the illumination optical system 801 shapes the light from the light source unit 800 into slit light having a predetermined shape suitable for exposure, and illuminates the reticle 31. The illumination optical system 801 has a function of uniformly illuminating the reticle 31 and a polarizing illumination function. The illumination optical system 801 includes, for example, a lens, a mirror, an optical integrator, a stop, and the like, and is formed by arranging a condenser lens, a fly-eye lens, an aperture stop, a condenser lens, a slit, and an imaging optical system in this order.

The reticle 31 is formed of, for example, quartz. The reticle 31 is formed with a pattern (circuit pattern) to be transferred to the substrate 83.

The reticle stage RS holds the reticle 31 via a reticle chuck (not shown), and is connected to a reticle driving mechanism (not shown). The reticle driving mechanism includes a linear motor or the like, and can move the reticle 31 held by the reticle stage RS by driving the reticle stage RS in the X-axis direction, the Y-axis direction, the Z-axis direction, and the rotation directions around the respective axes. Note that the position of the reticle 31 is measured by a reticle position measurement unit of light oblique-incidence type (not shown), and the reticle 31 is arranged at a predetermined position via the reticle stage RS.

The projection optical system 32 has a function of imaging the light from an object plane in an image plane. In this embodiment, the projection optical system 32 projects the light (diffracted light) having passed through the pattern of the reticle 31 onto the substrate 83, thereby forming the image of the pattern of the reticle 31 on the substrate. As the projection optical system 32, an optical system formed from a plurality of lens elements, an optical system (catadioptric optical system) including a plurality of lens elements and at least one concave mirror, an optical system including a plurality of lens elements and at least one diffractive optical element such as kinoform, or the like is used.

A photoresist is applied onto the substrate 83. The substrate 83 is a processing target object to which the pattern of the reticle 31 is transferred, and includes a wafer, a liquid crystal substrate, another processing target substrate, or the like.

The substrate stage WS holds the substrate 83 via a substrate chuck (not shown), and is connected to a substrate driving mechanism (not shown). The substrate driving mechanism includes a linear motor or the like, and can move the substrate 83 held by the substrate stage WS by driving the substrate stage WS in the X-axis direction, the Y-axis direction, the Z-axis direction, and the rotation directions around the respective axes. Further, a reference plate 39 is provided on the substrate stage WS.

The position of the reticle stage RS and the position of the wafer stage WS are monitored by, for example, a 6-axis interferometer 91 or the like, and the reticle stage RS and the substrate stage WS are driven at a constant speed ratio under the control of the control unit 1200.

The control unit 1200 is formed by a computer (information processing apparatus) including a CPU, a memory, and the like and, for example, operates the exposure apparatus EXA by comprehensively controlling respective units of the exposure apparatus EXA in accordance with a program stored in a storage unit. The control unit 1200 controls exposure processing of transferring the pattern of the reticle 31 to the substrate 83 by exposing the substrate 83 via the reticle 31. Further, in this embodiment, the control unit 1200 controls measurement processing in the position measurement apparatus 200 and correction processing (calculation processing) of a measurement value obtained by the position measurement apparatus 200. In this manner, the control unit 1200 also functions as a part of the position measurement apparatus 200.

In the exposure apparatus EXA, the light (diffracted light) having passed through the reticle 31 is projected onto the substrate 83 via the projection optical system 32. The reticle 31 and the substrate 83 are arranged in an optically conjugate relationship. The pattern of the reticle 31 is transferred to the substrate 83 by scanning the reticle 31 and the substrate 83 at a speed ratio of a reduction ratio of the projection optical system 32.

The position measurement apparatus 200 is a measurement apparatus for measuring the position of a target object. In this embodiment, the position measurement apparatus 200 measures the position of a mark 82 such as an alignment mark provided in the substrate 83. The arrangement of the position measurement apparatus 200 will be described below with reference to FIG. 7B. Note that since the position measurement apparatus 200 shown in FIG. 7B has an arrangement similar to that of the measurement unit 50 shown in FIG. 1B, a description thereof will be simplified here and only an outline thereof will be described.

The position measurement apparatus 200 includes an illumination system for illuminating the substrate 83 using the light from a light source 161, and an imaging system (detection system) for imaging the light from the mark 82 on the substrate (forming the image of the mark 82). The illumination system is formed by illumination optical systems 162, 163, and 166, an illumination aperture stop 164, a mirror M20, a relay lens 167, a polarization beam splitter 168, a λ/4 plate 170, and an objective optical system 171. The imaging system is formed by the objective optical system 171, the λ/4 plate 170, a detection aperture stop 169, the polarization beam splitter 168, and an imaging optical system 174, and configured to image the light from the mark 82 on the substrate in an image sensor 175. The image sensor 175 includes a plurality of pixels that detect the light from the mark 82, and functions as an image capturing unit that forms an image capturing region for capturing the mark 82 using the plurality of pixels. Based on the positional information of the substrate stage WS obtained by the laser interferometer 91 and the waveform of a detection signal obtained by detecting the image of the mark 82, the control unit 1200 obtains the position of the mark 82 on the substrate.

With reference to FIG. 8, the sequence of the exposure processing of transferring the pattern of the reticle 31 onto the substrate 83 by exposing the substrate 83 via the reticle 31 will be described. As has been described above, the exposure processing is performed by the control unit 1200 comprehensively controlling the respective units of the exposure apparatus EXA.

In step S101, the substrate 83 is loaded in the exposure apparatus EXA. In step S102, the surface (height) of the substrate 83 is detected by a shape measurement apparatus (not shown) to measure the surface shape of the entire substrate 83.

In step S103, calibration is performed. More specifically, based on the designed coordinate position of the reference mark provided in the reference plate 39 in the stage coordinate system, the wafer stage WS is driven so as to position the reference mark on the optical axis of the position measurement apparatus 200. Then, the positional shift of the reference mark with respect to the optical axis of the position measurement apparatus 200 is measured, and the stage coordinate system is reset based on the positional shift such that the origin of the stage coordinate system coincides with the optical axis of the position measurement apparatus 200. Next, based on the designed positional relationship between the optical axis of the position measurement apparatus 200 and the optical axis of the projection optical system 32, the substrate stage WS is driven so as to position the reference mark on the optical axis of the exposure light. Then, the positional shift of the reference mark with respect to the optical axis of the exposure light is measured via the projection optical system 32 by a TTL (Through The Lens) measurement system.

In step S104, based on the result of calibration obtained in step S103, the baseline between the optical axis of the position measurement apparatus 200 and the optical axis of the projection optical system 32 is determined.

In step S105, the position measurement apparatus 200 measures the position of the mark 82 provided in the substrate 83.

In step S106, global alignment is performed. More specifically, based on the measurement result obtained in step S105, the shift, the magnification, and the rotation with respect to the array of shot regions on the substrate 83 are calculated, and the regularity of the array of the shot regions is obtained. Then, a correction coefficient is obtained from the regularity of the array of the shot regions and the baseline, and the substrate 83 is aligned with the reticle 31 (exposure light) based on the correction coefficient.

In step S107, the substrate 83 is exposed while scanning the reticle 31 and the substrate 83 in a scanning direction (Y direction). At this time, based on the surface shape of the substrate 83 measured by the shape measurement apparatus, an operation of sequentially adjusting the surface of the substrate 83 to the imaging plane of the projection optical system 32 is also performed by driving the substrate stage WS in the Z direction and the tilt direction.

In step S108, it is determined whether exposure for all the shot regions of the substrate 83 is completed (that is, whether there is no unexposed shot region). If exposure for all the shot regions of the substrate 83 is not completed, the process returns to step S107, and steps S107 and S108 are repeated until exposure for all the shot regions is completed. On the other hand, if exposure for all the shot regions of the substrate 83 is completed, the process advances to step S109, and the substrate 83 is unloaded from the exposure apparatus EXA.

In this embodiment, when measuring the position of the mark 82 provided in the substrate 83 (S105), at least two different image capturing regions are set in the image sensor 175 of the position measurement apparatus 200. Further, the image sensor 175 is adjusted such that the relative ratio of the signal intensities of a detection signal in the at least two different image capturing regions falls within an allowable range. As adjustment of the image sensor 175, for example, the sensitivity is set for each of a plurality of pixels of the image sensor 175. Then, based on outputs from the image sensor 175 with the different sensitivities set therein, the position of the mark 82 provided in the substrate 83 is obtained.

Figure 9A:
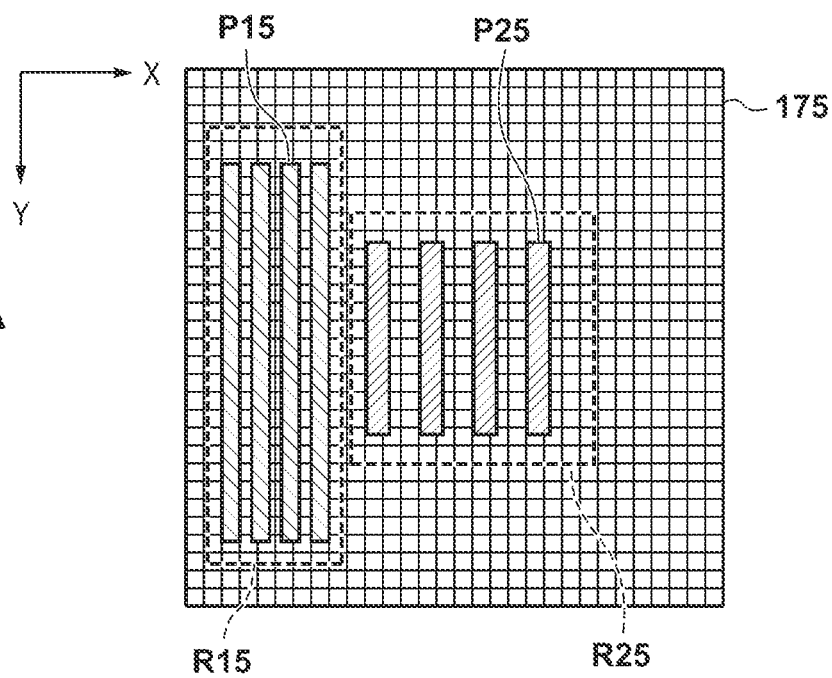
FIGS. 9A to 9C are views for explaining measurement processing of measuring the position of a mark in the second embodiment.
Figure 9B:
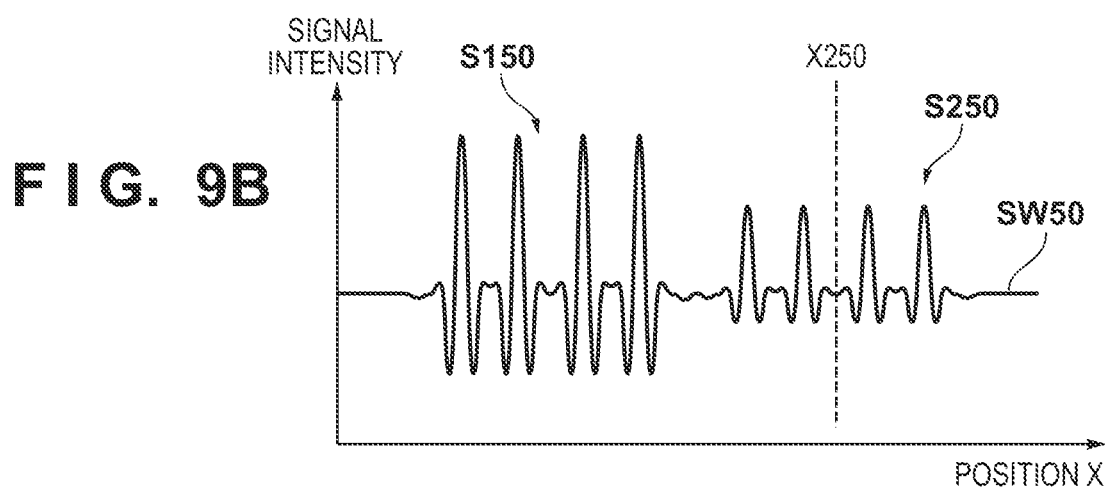
Figure 9C:
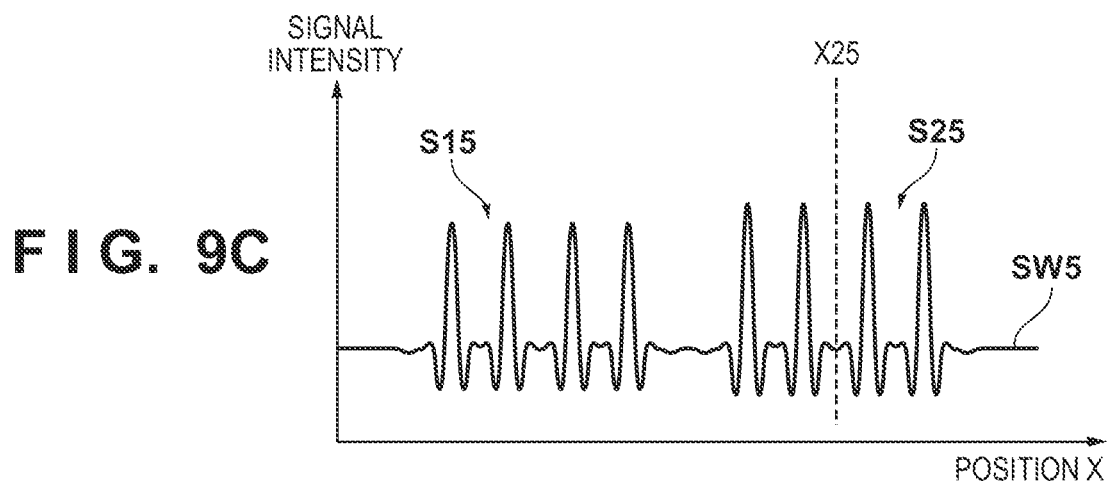

With reference to FIGS. 9A, 9B, and 9C, the measurement processing of measuring the position of the mark 82 provided in the substrate 83 in this embodiment will be described. FIG. 9A is a view showing an image P15 of a device pattern on the substrate formed on the image capturing region of the image sensor 175, and an image P25 of the mark 82 on the substrate. In the position measurement apparatus 200 including the control unit 1200, based on an output from the image sensor 175, the positional information of the mark 82 (image P25 thereof) in the image capturing region (observation visual field) of the image sensor 175 is obtained. As shown in FIG. 9A, in the image capturing region in the image sensor 175, the image P15 of the device pattern existing in a peripheral region around the mark 82 on the substrate is formed in the vicinity of the image P25 of the mark 82.

FIG. 9B is a view showing an example of a detection signal SW50 generated based on a captured image obtained by capturing the image P15 of the device pattern and the image P25 of the mark 82 shown in FIG. 9A by the image sensor 175. A waveform S150 included in the detection signal SW50 corresponds to the signal intensity (change thereof) of the device pattern, and a waveform S250 (change thereof) included in the detection signal SW50 corresponds to the signal intensity (change thereof) of the mark 82.

Here, with reference to FIG. 9B, a case will be described in which the intensity of the detection light from the device pattern on the substrate is higher than the intensity of the detection light from the mark 82 on the substrate. In this case, as shown in FIG. 9B, the signal intensity (waveform S150) of the device pattern is higher than the signal intensity (waveform S250) of the mark 82. Therefore, if the signal intensity in the waveform S150 exceeds the level detectable by the image sensor 175, for example, if it reaches the saturation level, the light amount detection becomes abnormal and the position of the mark 82 may not be obtained, that is, a measurement error may occur. To prevent this, it is conceivable to adjust the signal intensities from the device pattern and the mark 82 by controlling an output from a light amount adjustment unit (ND filters) or the light source 161 provided in the illumination system of the position measurement apparatus 200 or controlling the accumulation time of the image sensor 175. However, if the signal intensity in the observation visual field of the image sensor 175, that is, in the entire image capturing region is decreased, the signal intensity in the waveform S250 is also decreased together with the signal intensity in the waveform S150. With this, the electrical noise with respect to the signal intensity in the waveform S250 relatively increases, so that it becomes difficult to obtain, with high accuracy, a measurement value X250 indicating the central position of the mark 82 on the substrate from the waveform S250.

Therefore, in this embodiment, a technique is proposed in which it is possible to obtain, with high accuracy, the measurement value indicating the central position of the mark 82 even when there is a large difference between the intensity of the detection light from the mark 82 on the substrate and the intensity of the detection light from the device pattern on the substrate. More specifically, based on the position of the mark 82, at least two different image capturing regions are set in the image capturing region of the image sensor 175. In this embodiment, as shown in FIG. 9A, in correspondence with the device pattern (the peripheral region around the mark 82) on the substrate, a first image capturing region R15 is set so as to include the image P15 of the device pattern. Further, in order to capture the mark 82, a second image capturing region R25 is set so as to include the image P25 of the mark 82. Then, the image sensor 175 is adjusted such that the relative ratio of the intensity of the detection signal of the device pattern generated based on an output from the first image capturing region and the intensity of the detection signal of the mark 82 generated based on an output from the second image capturing region falls within an allowable range. As adjustment of the image sensor 175, for example, the sensitivity of each of a plurality of pixels of the image sensor 175 is set.

Note that since obtainment of the signal intensities and setting of the sensitivities (calculation of sensitivity correction values) are similar to those in the first embodiment, a detailed description thereof will be omitted here. Then, the position of the mark 82 is obtained based on an output from the image sensor 175 in which different sensitivities are set for the first image capturing region R15 and the second image capturing region R25.

FIG. 9C is a view showing an example of a detection signal SW5 generated based on a captured image obtained by capturing the image P15 of the device pattern and the image P25 of the mark 82 by the image sensor 175 in which different sensitivities are set for the first image capturing region R15 and the second image capturing region R25. Referring to FIG. 9C, a waveform S15 included in the detection signal SW5 corresponds to the signal intensity (change thereof) of the device pattern on the substrate, and a waveform S25 included in the detection signal SW5 corresponds to the signal intensity (change thereof) of the mark 82. In this embodiment, by setting the lower sensitivity for the pixels included in the first image capturing region R15 than for the pixels included in the second image capturing region R25, it is possible to decrease the signal intensity in the waveform S15 and avoid saturation of the signal intensity in the waveform S15. With this, it is possible to obtain, with high accuracy, a measurement value X25 indicating the central position of the mark 82 from the waveform S25.

Note that in the position measurement apparatus 200, the method of measuring the position of the mark 82 on the substrate is not limited to the method of obtaining the positional information of the mark 82 from the signal intensity of the mark 82. For example, phase information may be obtained based on a captured image output from the image sensor 175, and the positional information of the mark 82 may be obtained from the phase information.

In this embodiment, even when there is a large difference between the intensity of the detection light from the mark on the substrate and the intensity of the detection light from the peripheral region of the mark, by setting different sensitivities for the plurality of image capturing regions corresponding the mark and the peripheral region of the mark, respectively, it is possible to measure the position of the mark with high speed and high accuracy. Accordingly, it is possible to provide a position measurement apparatus capable of measuring the position of the mark on the substrate with high speed and high accuracy.

Third Embodiment

Figure 10A:
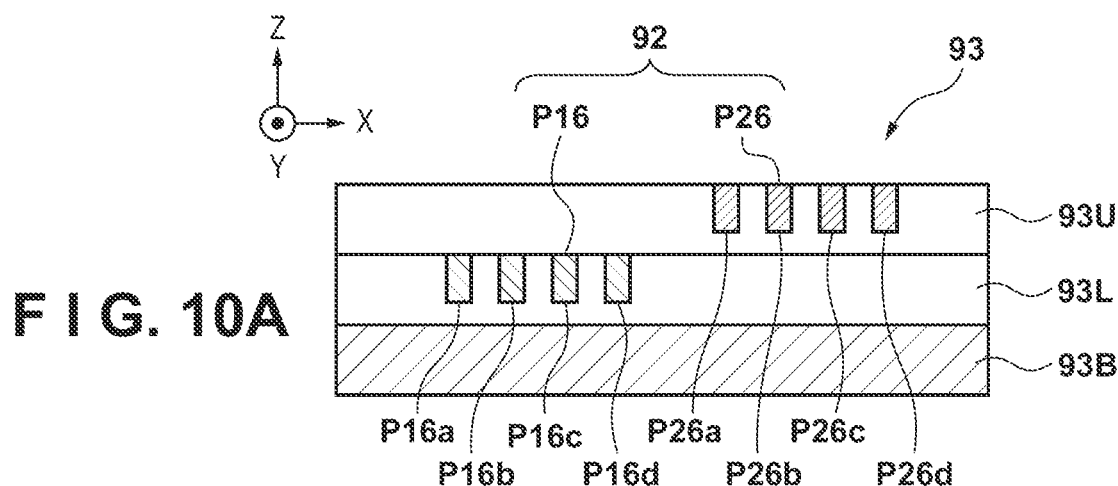
FIGS. 10A to 10C are views for explaining measurement processing of measuring the position of a mark in the third embodiment.
Figure 10B:
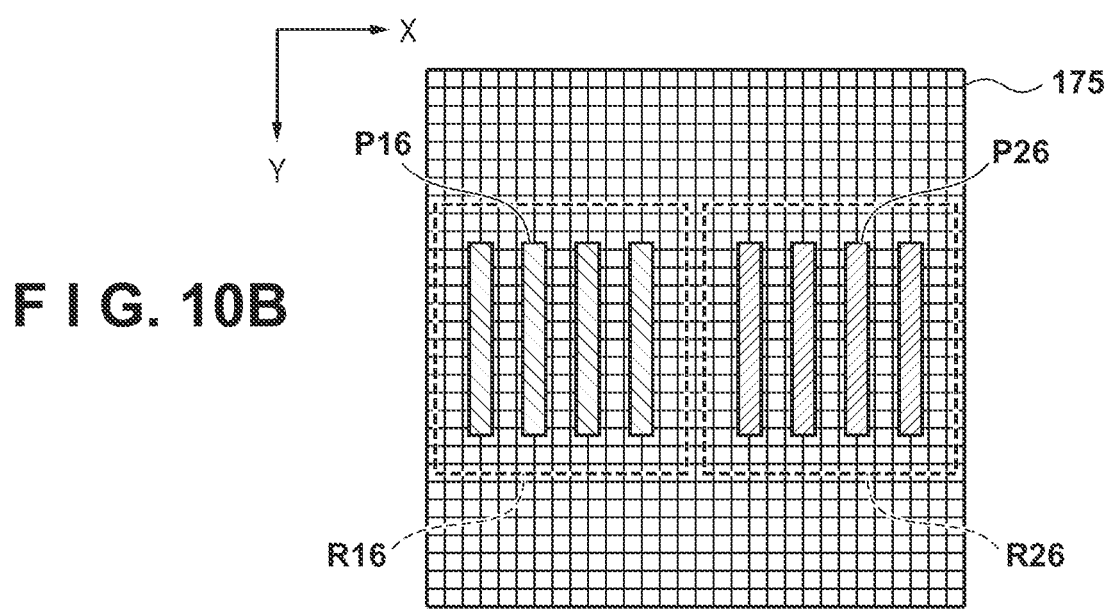
Figure 10C:
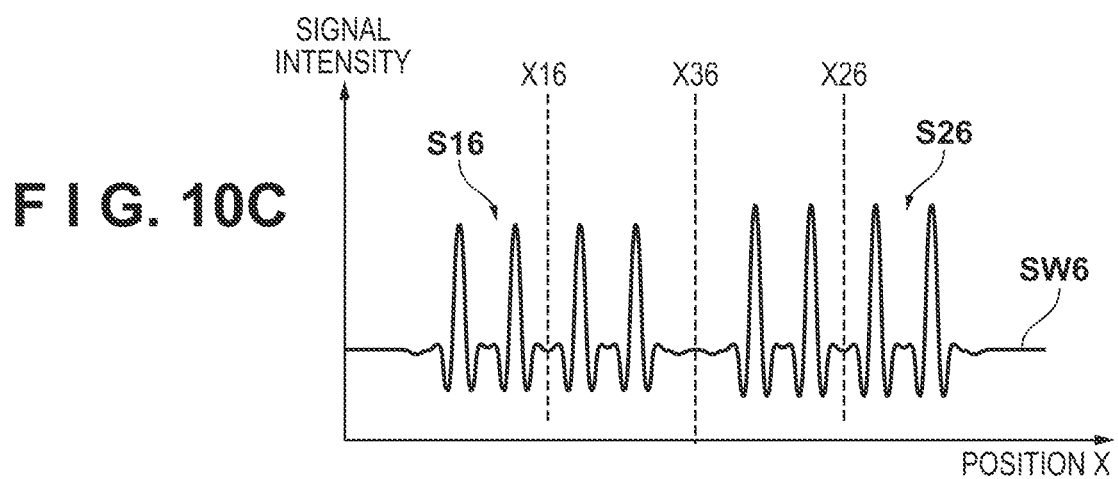

With reference to FIGS. 10A, 10B, and 10C, a position measurement apparatus in the third embodiment will be described. The position measurement apparatus has an arrangement similar to that of the position measurement apparatus 200 shown in FIG. 7B, so that a detailed description thereof will be omitted here. The position measurement apparatus in this embodiment is different from the position measurement apparatus 200 in that it measures not the position of a mark provided in one layer on a substrate (on a target object) but the position of a mark formed by a plurality of patterns provided in different layers on the substrate.

FIG. 10A is a view showing an example of the arrangement of a mark 92 provided in a substrate 93 serving as a measurement target object of the position measurement apparatus. In this embodiment, the substrate 93 is a substrate formed by three layers of a lowermost layer 93B, a first layer 93L, and a second layer 93U. The mark 92 is formed by a first pattern P16 provided in the first layer 93L and a second pattern P26 provided in the second layer 93U. The first pattern P16 includes four pattern elements P16a, P16b, P16c, and P16d, and the second pattern P26 includes four pattern elements P26a, P26b, P26c, and P26d.

The position measurement apparatus in this embodiment detects the mark 92, more specifically, the light (reflected light and scattered light) from each of the first pattern P16 and the second pattern P26 by an image sensor 175.

FIG. 10B is a view showing the image of the mark 92 formed on the image capturing region of the image sensor 175, more specifically, the image of the first pattern P16 and the image of the second pattern P26. FIG. 10C is a view showing an example of a detection signal SW6 generated based on a captured image obtained by capturing the image of the mark 92 shown in FIG. 10B by the image sensor 175. The detection signal SW6 is generated by integrating the signal intensities of respective pixels of the image sensor 175 in the Y direction in the captured image including the image of the mark 92 shown in FIG. 10B. Referring to FIG. 10C, a waveform S16 included in the detection signal SW6 corresponds to the signal intensity (change thereof) of the first pattern P16, and a waveform S26 included in the detection signal SW6 corresponds to the signal intensity (change thereof) of the second pattern P26. A control unit 1200 obtains a measurement value X16 indicating the central position of the first pattern P16 from the waveform S16, and obtains a measurement value X26 indicating the central position of the second pattern P26 from the waveform S26. Then, the control unit 1200 obtains the positional information of the mark 92 based on the measurement value X16 and the measurement value X26.

In this embodiment, based on the position of the mark 92, at least two different image capturing regions are set in the image capturing region of the image sensor 175. More specifically, as shown in FIG. 10B, a first image capturing region R16 for capturing the first pattern P16 and a second image capturing region R26 for capturing the second pattern P26 are set. Further, the image sensor 175 is adjusted such that the relative ratio of the intensity of the detection signal of the first pattern P16 generated based on an output from the first image capturing region R16 and the intensity of the detection signal of the second pattern P26 generated based on an output from the second image capturing region R26 falls within an allowable range. As adjustment of the image sensor 175, for example, the sensitivity of each of a plurality of pixels of the image sensor 175 is set. Note that since obtainment of the signal intensities and setting of the sensitivities (calculation of sensitivity correction values) are similar to those in the first embodiment, a detailed description thereof will be omitted here. Then, the position of the mark 92 is obtained based on an output from the image sensor 175 in which different sensitivities are set for the first image capturing region R16 and the second image capturing region R26.

As the method of obtaining the position of the mark 92, a method can be used in which a position X36 of the mark 92 is obtained from an average value of the measurement value X16 indicating the central position of the first pattern P16 and the measurement value X26 indicating the central position of the second pattern P26. Further, as another method, the position X36 of the mark 92 may be obtained by weighting each of the measurement value X16 indicating the central position of the first pattern P16 and the measurement value X26 indicating the central position of the second pattern P26. For example, each of the measurement values X16 and X26 shown in FIG. 10C may be weighted based on the sensitivities set for the first image capturing region R16 and the second image capturing region R26 shown in FIG. 10B and evaluation parameters of the waveforms S16 and S26. More specifically, examples of the evaluation parameter are the maximum value, minimum value, average value, variance including noise, half-value width or positional information in the signal intensity distribution, and the measurement value based on these values of the signal intensity. The weighting may be performed in consideration of, in addition to the evaluation parameter of the waveform, parameters such as the spatial position of the layer to which the pattern is exposed, the required alignment accuracy, and the throughput with respect to the layers provided with the first pattern P16 and the second pattern P26 respectively. With this, it becomes possible to measure the position of the mark 92 on the substrate with high accuracy and align a reticle (exposure light) and the substrate 93 with high accuracy.

As has been described above, according to the position measurement apparatus in this embodiment, not only the position of a mark provided in one layer but also the position of a mark formed by a plurality of patterns provided in different layers can be measured with high speed and high accuracy.

Fourth Embodiment

An article manufacturing method according to an embodiment of the present invention is suitable for, for example, manufacturing an article such as a device (a semiconductor device, a magnetic storage medium, a liquid crystal display device, or the like). The manufacturing method includes a step of exposing, by using an exposure apparatus EXA, a substrate with a photosensitive agent applied thereon (forming a pattern on the substrate), and a step of developing the exposed substrate (processing the substrate). In addition, the manufacturing method can include other well-known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article. Note that the above-described article manufacturing method may be performed by using a lithography apparatus such as an imprint apparatus or a drawing apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-013597 filed on Jan. 29, 2021, which is hereby incorporated by reference herein in its entirety.

What is claimed is:

1. A measurement method of capturing a first pattern and a second pattern provided in a target object by an image sensor including a first image capturing region for capturing the first pattern and a second image capturing region for capturing the second pattern, the method comprising:

sequentially performing first measurement processing of measuring a position of the first pattern and a position of the second pattern, and second measurement processing of measuring the position of the first pattern and the position of the second pattern;

causing a sensitivity of the first image capturing region and a sensitivity of the second image capturing region to be different from each other based on the position of the first pattern obtained in the first measurement processing and the position of the second pattern obtained in the second measurement processing;

causing the image sensor to capture an image including the first pattern and the second pattern; and obtaining the position of the first pattern and the position of the second pattern based on the image captured by the image sensor during the second measurement processing.

2. The method according to claim 1, wherein:

the first image capturing region and the second image capturing region each include a plurality of pixels, and the causing the sensitivities to be different from each other sets a sensitivity of each of the plurality of pixels included in the first image capturing region and the second image capturing region.

3. The method according to claim 1, wherein:

the first image capturing region and the second image capturing region each include a pixel, and the causing the sensitivities to be different from each other individually sets a sensitivity of the pixel included in the first image capturing region and a sensitivity of the pixel included in the second image capturing region.

4. The method according to claim 1, wherein the causing the sensitivities to be different from each other sets each of an intensity of a detection signal of the first pattern and an intensity of a detection signal of the second pattern to be lower than a saturation level of the image sensor.

5. The method according to claim 1, wherein:

the first image capturing region and the second image capturing region each include a plurality of pixels, and the causing the sensitivities to be different from each other adjusts a digital gain of each of the plurality of pixels included in the first image capturing region and the second image capturing region.

6. The method according to claim 1, wherein the causing the sensitivities to be different from each other sets a relative ratio of an intensity of a detection signal of the first pattern generated based on an output from the first image capturing region and an intensity of a detection signal of the second pattern generated based on an output from the second image capturing region to fall within an allowable range.

7. The method according to claim 1, wherein:

the first pattern and the second pattern are provided in different layers on the target object, and the obtaining obtains a position of a pattern formed by the first pattern and the second pattern from the position of the first pattern and the position of the second pattern.

8. The method according to claim 1, wherein:

the first measurement processing measures the position of the first pattern and the position of the second pattern with a first resolution in a first measurement range, and the second measurement processing measures the position of the first pattern and the position of the second pattern with a second resolution higher than the first resolution in a second measurement range smaller than the first measurement range.

9. A measurement method of capturing a first pattern and a second pattern provided in a target object by an image sensor, including a first image capturing region for capturing the first pattern and a second image capturing region for capturing the second pattern, and measuring a position of the first pattern and a position of the second pattern, the method comprising:

causing a sensitivity of the first image capturing region and a sensitivity of the second image capturing region to be different from each other;
causing the image sensor to capture an image including the first pattern and the second pattern; and
obtaining the position of the first pattern and the position of the second pattern based on the captured image,
wherein the causing the sensitivities to be different from each other sets one of the sensitivity of the first image capturing region or the sensitivity of the second image capturing region to 1.

10. A measurement method of capturing a first pattern and a second pattern provided in different layers on a target object by an image sensor, including a first image capturing region for capturing the first pattern and a second image capturing region for capturing the second pattern, and measuring a position of the first pattern and a position of the second pattern, the method comprising:
causing a sensitivity of the first image capturing region and a sensitivity of the second image capturing region to be different from each other;
causing the image sensor to capture an image including the first pattern and the second pattern;
obtaining the position of the first pattern and the position of the second pattern based on the captured image; and
obtaining a relative position between the first pattern and the second pattern from the position of the first pattern and the position of the second pattern.

11. A measurement apparatus for measuring a position of a first pattern and a position of a second pattern provided in a target object, the apparatus comprising:
an image sensor configured to capture the first pattern and the second pattern, the image sensor including:
a first image capturing region for capturing the first pattern; and
a second image capturing region for capturing the second pattern; and
a control unit, including a processor, configured to:
sequentially perform first measurement processing of measuring a position of the first pattern and a position of the second pattern, and second measurement processing of measuring the position of the first pattern and the position of the second pattern;
cause a sensitivity of the first image capturing region and a sensitivity of the second image capturing region to be different each other based on the position of the first pattern obtained in the first measurement processing and the position of the second pattern obtained in the second measurement processing;
cause the image sensor to capture an image including the first pattern and the second pattern; and
obtain the position of the first pattern and the position of the second pattern based on the image captured by the image sensor during the second measurement processing.

12. The apparatus according to claim 11, wherein:
the first image capturing region and the second image capturing region each include a plurality of pixels, and
the control unit causes the sensitivity of the first image capturing region and the sensitivity of the second image capturing region to be different each other by setting a sensitivity of each of the plurality of pixels included in the first image capturing region and the second image capturing region.

13. The apparatus according to claim 11, wherein:
the first image capturing region and the second image capturing region each include a pixel, and
the control unit causes the sensitivity of the first image capturing region and the sensitivity of the second image capturing region to be different each other by individually setting a sensitivity of the pixel included in the first image capturing region and a sensitivity of the pixel included in the second image capturing region.

14. The apparatus according to claim 11, wherein the control unit causes the sensitivity of the first image capturing region and the sensitivity of the second image capturing region to be different each other by setting each of an intensity of a detection signal of the first pattern and an intensity of a detection signal of the second pattern to be lower than a saturation level of the image sensor.

15. The apparatus according to claim 11, wherein:
the first image capturing region and the second image capturing region each include a plurality of pixels, and
the control unit causes the sensitivity of the first image capturing region and the sensitivity of the second image capturing region to be different each other by adjusting a digital gain of each of the plurality of pixels included in the first image capturing region and the second image capturing region.

16. The apparatus according to claim 11, wherein the control unit adjusts the image sensor by setting a relative ratio of an intensity of a detection signal of the first pattern generated based on an output from the first image capturing region and an intensity of a detection signal of the second pattern generated based on an output from the second image capturing region to fall within an allowable range.

17. The apparatus according to claim 11, wherein:
the first measurement processing measures the position of the first pattern and the position of the second pattern with a first resolution in a first measurement range, and
the second measurement processing measures the position of the first pattern and the position of the second pattern with a second resolution higher than the first resolution in a second measurement range smaller than the first measurement range.

18. The apparatus according to claim 11, wherein:
the first pattern and the second pattern are provided in different layers on the target object, and
the control unit obtains, from the position of the first pattern and the position of the second pattern, a position of a pattern formed by the first pattern and the second pattern.

19. A measurement apparatus for measuring a position of a first pattern and a position of a second pattern provided in a target object, the apparatus comprising:
an image sensor configured to capture the first pattern and the second pattern, the image sensor including:
a first image capturing region for capturing the first pattern; and
a second image capturing region for capturing the second pattern; and
a control unit, including a processor, configured to:
cause a sensitivity of the first image capturing region and a sensitivity of the second image capturing region to be different each other;
cause the image sensor to capture an image including the first pattern and the second pattern; and
obtain the position of the first pattern and the position of the second pattern based on the captured image,
wherein the control unit sets one of the sensitivity of the first image capturing region or the sensitivity of the second image capturing region to 1.

20. A measurement apparatus for measuring a position of a first pattern and a second pattern provided in different layers on a target object, the apparatus comprising:
- an image sensor configured to capture the first pattern and the second pattern, the image sensor including:
  - a first image capturing region for capturing the first pattern; and
  - a second image capturing region for capturing the second pattern; and
- a control unit, including a processor, configured to:
  - cause a sensitivity of the first image capturing region and a sensitivity of the second image capturing region to be different each other;
  - cause the image sensor to capture an image including the first pattern and the second pattern;
  - obtain the position of the first pattern and the position of the second pattern based on the captured image; and
  - obtain a relative position between the first pattern and the second pattern from the position of the first pattern and the position of the second pattern.

* * * * *